US011306392B2

(12) United States Patent
Shuto et al.

(10) Patent No.: US 11,306,392 B2
(45) Date of Patent: Apr. 19, 2022

(54) METHOD FOR PRODUCING OPTICAL FILM

(71) Applicant: NITTO DENKO CORPORATION, Ibaraki (JP)

(72) Inventors: Shunsuke Shuto, Ibaraki (JP); Satoru Saki, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 11 days.

(21) Appl. No.: 16/306,722

(22) PCT Filed: May 31, 2017

(86) PCT No.: PCT/JP2017/020314
§ 371 (c)(1),
(2) Date: Dec. 3, 2018

(87) PCT Pub. No.: WO2017/213001
PCT Pub. Date: Dec. 14, 2017

(65) Prior Publication Data
US 2019/0127845 A1 May 2, 2019

(30) Foreign Application Priority Data

Jun. 7, 2016 (JP) .............................. JP2016-113943
May 16, 2017 (JP) .............................. JP2017-097698

(51) Int. Cl.
*C23C 14/54* (2006.01)
*C23C 14/08* (2006.01)
(Continued)

(52) U.S. Cl.
CPC .......... *C23C 14/547* (2013.01); *C23C 14/083* (2013.01); *G02B 1/115* (2013.01); *G02B 1/116* (2013.01)

(58) Field of Classification Search
CPC ...... G02B 1/10; G02B 5/0236; C23C 14/081; C23C 14/547; C23C 14/548;
(Continued)

(56) References Cited

U.S. PATENT DOCUMENTS

2001/0005554 A1    6/2001  Nakamura et al.
2006/0040204 A1*   2/2006  Nagahama ........... G02B 5/0236
                                                              430/270.1
(Continued)

FOREIGN PATENT DOCUMENTS

JP    2000-178717 A    6/2000
JP    2001-249221 A    9/2001
(Continued)

OTHER PUBLICATIONS

Notification of Transmital of Translation of the International Preliminary Report on Patentability (Form PCT/IB/338) issued in counterpart International Application No. PCT/JP2017/020314 dated Dec. 20, 2018 with Forms PCT/IB/373 and PCT/ISA/237. (7 pages).

(Continued)

Primary Examiner — Audrey Y Chang
(74) Attorney, Agent, or Firm — Westerman, Hattori, Daniels & Adrian, LLP

(57) ABSTRACT

In a preliminary deposition for producing an optical film in which multilayered optical thin-film is formed on a film substrate, a plurality of sputtering chambers are simultaneously energized to deposit a stacked body of thin-films made of two or more different materials on the film substrate, and the thicknesses of the plurality of thin-films are calculated from the optical properties obtained by the optical measuring unit (80) equipped in a sputtering apparatus. Measurement of the thicknesses and adjusting the deposition conditions for thin-films are repeated until the optical properties (Continued)

obtained by the optical measurement unit or the thickness of the respective thin-films calculated from the optical properties falls within a prescribed range.

18 Claims, 8 Drawing Sheets

(51) Int. Cl.
    *G02B 1/116* (2015.01)
    *G02B 1/115* (2015.01)

(58) Field of Classification Search
    CPC ....... C23C 14/544; C23C 14/34; C23C 14/52; C23C 14/542; B29D 11/00; G01B 11/06; H01J 37/32935
    USPC .................. 359/586; 428/446, 457; 427/162; 204/192.13
    See application file for complete search history.

(56) References Cited

U.S. PATENT DOCUMENTS

| | | | |
|---|---|---|---|
| 2007/0285643 A1* | 12/2007 | Wedowski | G03F 7/70958 355/67 |
| 2009/0161521 A1* | 6/2009 | Kamada | G11B 7/245 369/112.22 |
| 2009/0233108 A1* | 9/2009 | Tsukamoto | C23C 14/081 428/446 |
| 2010/0221575 A1* | 9/2010 | Stull | C03C 17/3644 428/680 |
| 2011/0176104 A1 | 7/2011 | Suzuki | |
| 2015/0021168 A1* | 1/2015 | Lotz | C23C 14/547 204/192.13 |

FOREIGN PATENT DOCUMENTS

| | | |
|---|---|---|
| JP | 2002-277215 A | 9/2002 |
| JP | 2006-83404 A | 3/2006 |
| JP | 2006-336029 A | 12/2006 |
| JP | 2007-182601 A | 7/2007 |
| JP | 2008-7790 A | 1/2008 |
| JP | 2009-221541 A | 10/2009 |
| JP | 2010-182769 A | 8/2010 |
| JP | 2010-216854 A | 9/2010 |
| JP | 2011-133468 A | 7/2011 |
| JP | 2014-034701 A | 2/2014 |
| KR | 101231116 B1 | 2/2013 |
| TW | 201437407 A | 10/2014 |
| TW | 201516172 A | 5/2015 |
| WO | 2011/046050 A1 | 4/2011 |

OTHER PUBLICATIONS

International Search Report dated Aug. 8, 2017, issued in counterpart application No. PCT/JP2017/020314 (2 pages).

Office Action dated Jul. 3, 2020, issued in counterpart TW Application No. 106118815, with English Translation. (24 pages).

Office Action dated Feb. 23, 2021, issued in counterpart to TW Application No. 106118815, with English Translation. (7 pages).

Office Action dated Mar. 2, 2021, issued in counterpart to KR Application No. 10-2018-7035461, with English Translation. (15 pages).

Office Action dated May 7, 2021, issued in counterpart JP Application No. 2017-097698, with English translation. (6 pages).

* cited by examiner

FIG. 4A

| sputtering chamber | | 1 | 2 | 3 | 4 | 5 | 6 | 7 | 8 | 9 | 10 |
|---|---|---|---|---|---|---|---|---|---|---|---|
| thin-film | material | $SiO_x$ | $Nb_2O_5$ | $SiO_2$ | $Nb_2O_5$ | | | | $SiO_2$ | | |
| | sub thin-film | 30 | 51 | 52 | 53a | 53b | 53c | 53d | 54a | 54b | 54c |
| preliminary deposition | S611 | v611 | | | | | | | | | |
| | S612 | v612 | | | | | | | | | |
| | S613 | v613 | | | | | | | | | |
| | S614 | v614 | | | | | | | | | |
| | S615 | V | | | | | | | | | |
| main deposition | | V | | | | | | | | | |

FIG. 4B

| sputtering chamber | | 1 | 2 | 3 | 4 | 5 | 6 | 7 | 8 | 9 | 10 |
|---|---|---|---|---|---|---|---|---|---|---|---|
| thin-film | material | $SiO_x$ | $Nb_2O_5$ | $SiO_2$ | $Nb_2O_5$ | | | | $SiO_2$ | | |
| | sub thin-film | 30 | 51 | 52 | 53a | 53b | 53c | 53d | 54a | 54b | 54c |
| preliminary deposition | S621 | v621 | | | | | | | | | |
| | S622 | v622 | | | | | | | | | |
| | S623 | v623 | | | | | | | | | |
| | S624 | v624 | | | | | | | | | |
| | S625 | V | | | | | | | | | |
| main deposition | | V | | | | | | | | | |

FIG. 4C

| sputtering chamber | | 1 | 2 | 3 | 4 | 5 | 6 | 7 | 8 | 9 | 10 |
|---|---|---|---|---|---|---|---|---|---|---|---|
| thin-film | material | $SiO_x$ | $Nb_2O_5$ | $SiO_2$ | $Nb_2O_5$ | | | | $SiO_2$ | | |
| | sub thin-film | 30 | 51 | 52 | 53a | 53b | 53c | 53d | 54a | 54b | 54c |
| preliminary deposition | S831 | v631 | | | | | | | | | |
| | S632 | v632 | | | | | | | | | |
| | S633 | v633 | | | | | | | | | |
| | S634 | v634 | | | | | | | | | |
| | S635 | v635 | | | | | | | | | |
| | S636 | v636 | | | | | | | | | |
| | S637 | v637 | | | | | | | | | |
| | S638 | v638 | | | | | | | | | |
| | S639 | v639 | | | | | | | | | |
| | S640 | V | | | | | | | | | |
| main deposition | | V | | | | | | | | | |

Legend:
- non-discharged
- discharged, deposition conditions not adjusted
- discharged, adjusting deposition conditions
- discharged, main deposition

FIG. 6A

| sputtering chamber | | | 1 | 2 | 3 | 4 | 5 | 6 | 7 | 8 | 9 | 10 |
|---|---|---|---|---|---|---|---|---|---|---|---|---|
| thin-film | material | | $SiO_x$ | $Nb_2O_5$ | $SiO_2$ | $Nb_2O_5$ | | | | $SiO_2$ | | |
| | sub thin-film | | 30 | 51 | 52 | 53a | 53b | 53c | 53d | 54a | 54b | 54c |
| preliminary deposition | S101 | v101 | | | | | | | | | | |
| main deposition | | V | | | | | | | | | | |

FIG. 6B

| sputtering chamber | | | 1 | 2 | 3 | 4 | 5 | 6 | 7 | 8 | 9 | 10 |
|---|---|---|---|---|---|---|---|---|---|---|---|---|
| thin-film | material | | $SiO_x$ | $Nb_2O_5$ | $SiO_2$ | $Nb_2O_5$ | | | | $SiO_2$ | | |
| | sub thin-film | | 30 | 51 | 52 | 53a | 53b | 53c | 53d | 54a | 54b | 54c |
| preliminary deposition | S111 | v111 | | | | | | | | | | |
| | S112 | v112 | | | | | | | | | | |
| | S113 | v113 | | | | | | | | | | |
| | S114 | v114 | | | | | | | | | | |
| | S115 | v115 | | | | | | | | | | |
| | S116 | v116 | | | | | | | | | | |
| | S117 | V | | | | | | | | | | |
| main deposition | | V | | | | | | | | | | |

FIG. 6C

| sputtering chamber | | | 1 | 2 | 3 | 4 | 5 | 6 | 7 | 8 | 9 | 10 |
|---|---|---|---|---|---|---|---|---|---|---|---|---|
| thin-film | material | | $SiO_x$ | $Nb_2O_5$ | $SiO_2$ | $Nb_2O_5$ | | | | $SiO_2$ | | |
| | sub thin-film | | 30 | 51 | 52 | 53a | 53b | 53c | 53d | 54a | 54b | 54c |
| preliminary deposition | S121 | v121 | | | | | | | | | | |
| | S122 | v122 | | | | | | | | | | |
| | S123 | v123 | | | | | | | | | | |
| | S124 | v124 | | | | | | | | | | |
| | S125 | v125 | | | | | | | | | | |
| | S126 | v126 | | | | | | | | | | |
| | S127 | V | | | | | | | | | | |
| main deposition | | V | | | | | | | | | | |

FIG. 6D

| sputtering chamber | | | 1 | 2 | 3 | 4 | 5 | 6 | 7 | 8 | 9 | 10 |
|---|---|---|---|---|---|---|---|---|---|---|---|---|
| thin-film | material | | $SiO_x$ | $Nb_2O_5$ | $SiO_2$ | $Nb_2O_5$ | | | | $SiO_2$ | | |
| | sub thin-film | | 30 | 51 | 52 | 53a | 53b | 53c | 53d | 54a | 54b | 54c |
| preliminary deposition | S131 | v131 | | | | | | | | | | |
| | S132 | v132 | | | | | | | | | | |
| | S133 | v133 | | | | | | | | | | |
| | S134 | v134 | | | | | | | | | | |
| | S135 | v135 | | | | | | | | | | |
| | S136 | v136 | | | | | | | | | | |
| | S137 | V | | | | | | | | | | |
| main deposition | | V | | | | | | | | | | |

FIG. 7A

| sputtering chamber | | 1 | 2 | 3 | 4 | 5 | 6 | 7 | 8 | 9 | 10 |
|---|---|---|---|---|---|---|---|---|---|---|---|
| thin-film | material | $SiO_x$ | $Nb_2O_5$ | $SiO_2$ | $Nb_2O_5$ | | | | $SiO_2$ | | |
| | sub thin-film | 30 | 51 | 52 | 53a | 53b | 53c | 53d | 54a | 54b | 54c |
| preliminary deposition | S141 | v141 | | | | | | | | | |
| | S142 | v142 | | | | | | | | | |
| | S143 | v143 | | | | | | | | | |
| | S144 | v144 | | | | | | | | | |
| | S145 | V | | | | | | | | | |
| main deposition | | V | | | | | | | | | |

FIG. 7B

| sputtering chamber | | 1 | 2 | 3 | 4 | 5 | 6 | 7 | 8 | 9 | 10 |
|---|---|---|---|---|---|---|---|---|---|---|---|
| thin-film | material | $SiO_x$ | $Nb_2O_5$ | $SiO_2$ | $Nb_2O_5$ | | | | $SiO_2$ | | |
| | sub thin-film | 30 | 51 | 52 | 53a | 53b | 53c | 53d | 54a | 54b | 54c |
| preliminary deposition | S151 | v151 | | | | | | | | | |
| | S152 | v152 | | | | | | | | | |
| | S153 | v153 | | | | | | | | | |
| | S154 | v154 | | | | | | | | | |
| | S155 | V | | | | | | | | | |
| main deposition | | V | | | | | | | | | |

FIG. 7C

| sputtering chamber | | 1 | 2 | 3 | 4 | 5 | 6 | 7 | 8 | 9 | 10 |
|---|---|---|---|---|---|---|---|---|---|---|---|
| thin-film | material | $SiO_x$ | $Nb_2O_5$ | $SiO_2$ | $Nb_2O_5$ | | | | $SiO_2$ | | |
| | sub thin-film | 30 | 51 | 52 | 53a | 53b | 53c | 53d | 54a | 54b | 54c |
| preliminary deposition | S161 | v161 | | | | | | | | | |
| | S162 | v162 | | | | | | | | | |
| | S163 | v163 | | | | | | | | | |
| | S164 | v164 | | | | | | | | | |
| | S165 | V | | | | | | | | | |
| main deposition | | V | | | | | | | | | |

METHOD FOR PRODUCING OPTICAL FILM

TECHNICAL FIELD

The present invention relates to a method for producing an optical film including a multilayered optical thin-film on a film substrate.

BACKGROUND ART

A functional optical film such as an anti-reflection film, a transparent conductive film, an electromagnetic wave shielding film and a solar radiation adjustment film, includes a stack of optical thin-films having different refractive indexes (multilayered optical thin-film) on a film substrate. Materials used for optical thin-film include oxides such as silicon oxides and metal oxides and metallic materials.

A sputtering method is widely used for forming the multilayered optical thin-film on the film substrate. By using a roll-to-roll sputtering apparatus in which a plurality of targets can be arranged along a film substrate conveying path line, the multilayered optical thin-film can be formed on the film substrate with one pass, whereby production efficiency of the optical film can be enhanced.

In the multilayered optical thin-film, reflection and transmission characteristics of light are adjusted utilizing multiple reflection interference to realizes desired optical properties. In order to exert these characteristics, it is necessary to adjust properties (particularly, a refractive index) and thickness of each of the optical thin-films composing the multilayered film within specific ranges. Particularly, in an optical film such as an anti-reflection film used for a display device, high uniformities of properties and thickness are required for of each of the optical thin-films. Therefore, in production of the multilayered optical thin-film, in order that properties and thickness of each of the optical thin-films can be constant, it is necessary to strictly manage deposition conditions and to suppress variations of the properties and thickness in a width direction and a longitudinal direction.

As a method for constantly maintaining properties and thickness of the thin-film, there is known a method (plasma emission monitor (PEM) control) of sensing plasma emission intensity of sputtering discharge and feeding back the sensed plasma emission intensity to a gas introduction amount. For example, in reactive sputtering using a metal target and oxidizing gas such as oxygen, a control value (a set point: SP) of the emission intensity is set within a predetermined range, and an oxygen introduction amount is adjusted so that the emission intensity remains within this range, whereby properties and thickness of an oxide thin-film can be kept constant.

Uniformity of the optical thin-film can be further enhanced by combing a control of gas introduction amount by the PEM control and a control based on an in-line measurement result of optical properties of the thin-film. For example, in Patent Document 1, a flow rate of oxygen is controlled (PEM control) in formation of the optical thin-film by the sputtering such that the plasma emission intensity remains within a predetermined range. In addition to this, continuous deposition is performed while in-lime measurement of a spectral reflectance after deposition of the optical thin-film is performed and a setting range of the PEM emission intensity is changed such that the spectral reflectance remains within a predetermined range.

Even if a slight environmental change following erosion and others of the target occurs during the deposition, the deposition conditions can be finely adjusted so as to deal with this environmental change by combing the PEM control and the control based on the in-line optical measurement. Accordingly, an optical thin-film excellent in uniformity of the optical properties in the longitudinal direction and the width direction is obtained.

In main deposition carried out in order to acquire products, uniformity of the optical properties can be maintained by applying the control as described above. Meanwhile, in order to form the multilayered optical thin-film having target optical properties, setting of initial deposition conditions at the time of starting the main deposition is important. In deposition of the optical thin-film by roll-to-roll sputtering, preliminary deposition is performed before starting the main deposition for the purpose of setting conditions of the main deposition, etc. For example, Patent Document 2 discloses a multilayered optical thin-film formed by stacking high-refractive-index transparent thin-films and metal conductor thin-films alternately with each other. Patent Document 2 states that, in the preliminary deposition before the main deposition, single-layer thin-films are formed for each of layers, and calculation of a deposition rate and adjustment of a roll temperature are performed.

PRIOR ART DOCUMENTS

Patent Documents

Patent Document 1: International Patent Publication WO2011/046050

Patent Document 2: Japanese Patent Application Laid-Open No. 2001-249221

SUMMARY OF THE INVENTION

Problems to be Solved by the Invention

In the preliminary deposition of the multilayered optical thin-film, in accordance with a method of sequentially adjusting the deposition conditions of the single-layer thin-films, the number of times that the deposition conditions are adjusted is increased following an increase in the stacking number of thin-films. Therefore, the time required for the preliminary deposition is lengthened, resulting in an increase in a material loss and a decrease in productivity. Particularly, in the case of adjusting the deposition conditions at a plurality of positions in the width direction in order to uniform the thickness in the width direction, it takes a lot of time to set initial conditions due to many parameters to be adjusted. Moreover, when adjustment accuracy in the preliminary deposition is low, it takes a time to finely adjust the deposition conditions in the main deposition. Therefore, a further increase in the material loss and a further decrease in the productivity may be brought about. In view of the problems as described above, an object of the present invention is to improve efficiency in adjusting the deposition conditions in the preliminary deposition of the multilayered optical thin-film, and to enhance the productivity of the optical film including the multilayered optical thin-film and enhance the uniformity of the optical properties of the optical film.

Means for Solving the Problems

The present invention relates to a method for producing an optical film including a multilayered optical thin-film composed of a plurality of thin-films on a film substrate. Examples of the optical film include an anti-reflection film having a multilayered optical thin-film (anti-reflection layer) composed of a plurality of oxide thin-films or the like.

In the present invention, in a sputtering deposition apparatus including a plurality of sputtering chambers along a conveyance direction of the film substrate, a multilayered optical thin-film composed of a plurality of thin-films is formed on a film substrate while the film substrate is continuously conveyed in the sputtering deposition apparatus. In preliminary deposition performed before the main deposition, a plurality of sputtering chambers is energized simultaneously, and two or more thin-films having different refractive indexes are formed on the film substrate. Optical properties of a stacked body in which the plurality of thin-films is formed on the film substrate are subjected to in-line measurement, and thicknesses of the respective thin-films are calculated on the basis of results of the measurement. On the basis of results of thickness calculation, deposition conditions for the respective thin-films are adjusted. It is preferable to adjust the deposition conditions such that the optical properties obtained by the optical measuring unit or the thicknesses of the plurality of thin-films calculated from the optical characteristics fall within predetermined ranges.

In an adjustment step, it is preferable that reflection spectrum of the stacked body in which the plurality of thin-films is formed on the film substrate is measured by the optical measuring unit, and the thicknesses of the plurality of thin-films are calculated from the reflection spectrum. In this case, it is preferable that the deposition conditions are adjusted such that measured values of the thicknesses of the plurality of thin-films fall within predetermined ranges, or differences between the reflection spectrum obtained by the measurement by the optical measuring unit and target reflection spectrum fall within predetermined ranges.

Preferably, optical measurement in the adjustment step is carried out at a plurality of positions in a width direction of the film substrate, and preferably, the deposition conditions are adjusted on the basis of measurement results at the plurality of positions in the width direction, and a thickness distribution of each of the thin-films in the width direction is reduced.

In one embodiment, at least one of the plurality of thin-films which constitute the multilayered optical thin-film is a stacked layer of a plurality of sub-thin-films deposited in two or more sputtering chambers. Preferably, the plurality of sub-thin-films which constitute one stacked layer is subjected to the adjustment of the deposition conditions in different adjustment steps. Preferably, in the preliminary deposition, conveyance speeds of the film substrate in a plurality of the adjustment steps are the same.

The film substrate used in the preliminary deposition may be the same as or different from the film substrate for use in the main deposition. For example, in order to reduce back-surface reflection and to enhance measurement accuracy for the thicknesses and adjustment accuracy for the deposition conditions, a light absorbing film substrate or the like may be used in the preliminary deposition. In at least one of the preliminary deposition and the main deposition, a laminated body in which a light absorbing member is releasably attached to a surface of a transparent film on which the thin-film is not formed with an adhesive layer interposed therebetween may be used as the film substrate. In order to enhance the production efficiency, it is preferable to use the same film substrate in the preliminary deposition and the main deposition. Particularly, it is preferable to carry out the main deposition continuously, after the preliminary deposition, in a state where the energization to the sputtering chambers continues.

Effects of the Invention

In the production method of the present invention, in the preliminary deposition for determining the deposition conditions of the multilayered optical thin-film, the stacked body composed of the plurality of thin-films is formed on the film substrate, and the deposition conditions are adjusted while the respective thicknesses of the plurality of thin-films are measured by the in-line optical measurement. Since the deposition conditions for the plurality of thin-films are adjusted by one adjustment step, the number of adjustment steps in the preliminary deposition can be reduced, and the time required for the preliminary deposition can be shortened.

BRIEF DESCRIPTION OF THE DRAWINGS

FIGS. 4A to 4C each illustrates a summary of an adjustment method of deposition conditions in preliminary deposition in the conventional technology.

FIGS. 6A to 6D each illustrate summary of a method of adjusting deposition conditions in preliminary deposition in a production method of the present invention.

FIGS. 7A to 7C each illustrate summary of a method of adjusting deposition conditions in preliminary deposition in a production method of the present invention.

MODE FOR CARRYING OUT THE INVENTION

The present invention relates to a method for producing an optical film including a multilayered optical thin-film composed of stack of optical thin-films having different refractive indexes on a film substrate. More specifically, the present invention relates to a method for forming the multilayered optical thin-film on the film substrate, and to a preliminary deposition method for adjusting deposition conditions of the multilayered optical thin-film.

[Optical Film]

As an example of an optical film including a multilayered optical thin-film on a film substrate, an anti-reflection film is mentioned. The anti-reflection film includes an anti-reflection layer composed of the multilayered optical thin-film on the film substrate such as a transparent film and a polarizing plate. In the anti-reflection film, an optical thickness (a product of a refractive index and a thickness) of the thin-film that constitutes the anti-reflection layer is set such that inverted phases of incident light and reflected light cancel each other, whereby a reflectance can be reduced in a wide wavelength range of visible light.

Figure 1:
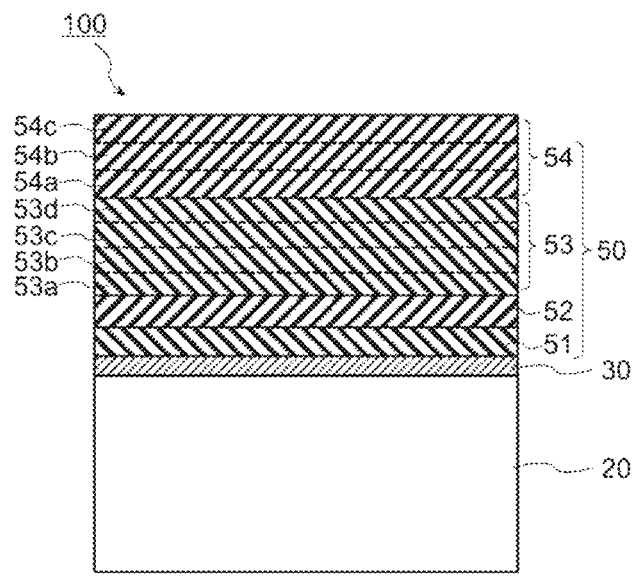
FIG. 1 is a schematic cross-sectional view illustrating a stacking configuration example of an anti-reflection film.

FIG. 1 is a cross-sectional view schematically illustrating an example of stacking configuration of the anti-reflection film. An anti-reflection film 100 in FIG. 1 includes an anti-reflection layer 50 composed of a multilayered optical thin-film on a film substrate 20 with an adhesion enhancement layer 30 interposed therebetween. FIG. 1 illustrates the anti-reflection layer 50 composed of a stack of four thin-films 51, 52, 53 and 54.

As the film substrate 20, a transparent film, a polarizing plate or the like is used. Examples of resin material that constitutes the transparent film includes: polyesters such as polyethylene terephthalate (PET), polybutylene terephthalate (PBT) and polyethylene naphthalate (PEN); cellulose-based polymers such as diacetyl cellulose and triacetylcellulose; acryl-based polymers such as polymethyl methacrylate; styrene-based polymers such as polystyrene and an acrylonitrile/styrene copolymer; cyclic polyolefins such as polynorbornene; and polycarbonate. A thickness of the film substrate 20 is about 5 to 300 μm. On a surface of the film substrate 20, on which the anti-reflection layer 50 is formed, a hard coating layer, an anti-glare layer or the like may be provided.

By depositing the adhesion enhancement layer 30 between the film substrate 20 and the anti-reflection layer 50, adhesion between the film substrate that is an organic material and the anti-reflection layer that is an inorganic material can be enhanced. A thickness of the adhesion enhancement layer 30 is, for example, about 1 to 30 nm. A thin-film in the multilayered optical thin-film, which is disposed in contact with the film substrate 20, may have a function as the adhesion enhancement layer. For example, an oxide layer with a smaller oxygen amount than stoichiometric composition is disposed as the adhesion enhancement layer 30 on the film substrate 20, whereby high transparency and adhesion to the anti-reflection layer can be made compatible with each other. The amount of oxygen of the adhesion enhancement layer 30 is preferably about 60 to 95% of the stoichiometric composition. For example, in the case of forming a silicon oxide ($SiO_x$) layer as the adhesion enhancement layer 30, x is preferably about 1.2 to 1.9.

Examples of the materials of the thin-films which constitute the anti-reflection layer 50 include oxides, nitrides, fluorides and the like. For example, low-refractive-index materials having a refractive index of 1.6 or less at a wavelength of 550 nm include silicon oxide magnesium fluoride and the like. High-refractive-index materials having a refractive index of 1.9 or more at a wavelength of 550 nm include titanium oxide, niobium oxide, zirconium oxide, tin-doped indium oxide (indium tin oxide: ITO), antimony-doped tin oxide (ATO) and the like. In addition to the low-refractive-index layer and the high-refractive-index layer, a thin-film composed of, for example, titanium oxide or a mixture of the above-described low-refractive-index material and high-refractive-index material may be formed as an intermediate-refractive-index layer having a refractive index of about 1.50 to 1.85.

Examples of the stacking configuration of the anti-reflection layer 50 include: a two-layer configuration consisting of a high-refractive-index layer having an optical thickness of about 240 nm to 260 nm and a low-refractive-index layer with an optical thickness of about 120 nm to 140 nm, from the film substrate 20-side; a three-layer configuration consisting of an intermediate-refractive-index layer having an optical thickness of about 170 nm to 180 nm, a high-refractive-index layer having an optical thickness of about 60 nm to 70 nm and a low-refractive-index layer having an optical thickness of about 135 nm to 145 nm, from the film substrate 20-side; a four-layer configuration consisting of a high-refractive-index layer having an optical thickness of about 25 nm to 55 nm, a low-refractive-index layer having an optical thickness of about 35 nm to 70 nm, a high-refractive-index layer having an optical thickness of about 60 nm to 250 nm and a low-refractive-index layer having an optical thickness of about 100 nm to 180 nm, from the film substrate 20-side; and a five-layer configuration consisting of a low-refractive-index layer having an optical thickness of about 15 nm to 30 nm, a high-refractive-index layer having an optical thickness of about 20 nm to 40 nm, a low-refractive-index layer having an optical thickness of about 20 nm to 40 nm, a high-refractive-index layer having an optical thickness of about 240 nm to 290 nm and a low-refractive-index layer having an optical thickness of about 100 nm to 200 nm, from the film substrate 20-side. Ranges of refractive indexes and thicknesses of the thin-films constituting the anti-reflection layer are not limited to the above exemplification. The anti-reflection layer 50 may be a stack of six or more thin-films. In order to reduce a reflection on an air interface, the thin-film 54 arranged as an outermost layer of the anti-reflection layer is preferably a low-refractive-index layer.

The optical film, as an object of the present invention, is not limited to the anti-reflection film, as long as it includes a multilayered optical thin-film on a film substrate. For example, in an electromagnetic wave shielding film or a solar radiation adjustment film, a metal thin-film that reflects an electromagnetic wave, an infrared ray or the like and a metal oxide thin-film are stacked, whereby shielding properties against an electromagnetic wave with a specific wavelength and transparency of visible light are made compatible with each other. In a transparent conductive film, one or more dielectric thin-films and a transparent electrode layer made of ITO or the like are stacked on a transparent film substrate, whereby the dielectric thin-film plays a role as an optical adjustment layer, and can neutralize hues of transmitted visible light and reflected visible light.

As described above, the functional optical film including the multilayered optical thin-film on the film substrate adjusts light reflection and transmission properties utilizing multiple reflection interference of the multilayered optical thin-film. Therefore, in order to obtain an optical film having expected properties, it is necessary to appropriately control the (optical) thickness of each of the optical thin-films which constitute the multilayered optical thin-film. If each of the optical thin-films has in-plane thickness distribution, unevenness occurs in the reflectance and the transmittance, and such unevenness is visually recognized as color unevenness. Particularly, in an optical film for a display, such as an anti-reflection film, reflected light properties thereof affect quality and visibility of the display. Therefore, it is required that the thickness of each optical thin-film be strictly controlled.

[Deposition Apparatus]

A roll-to-roll sputtering deposition apparatus is used for deposition of the multilayered optical thin-film on the film substrate. In the roll-to-roll method, deposition is carried out while the film substrate is continuously conveyed in a sputtering apparatus in which a plurality of sputtering targets is disposed along a film substrate conveying direction. Therefore, a plurality of thin-films can be deposited along a single pass from unwinding of the film substrate to winding thereof.

Figure 2:
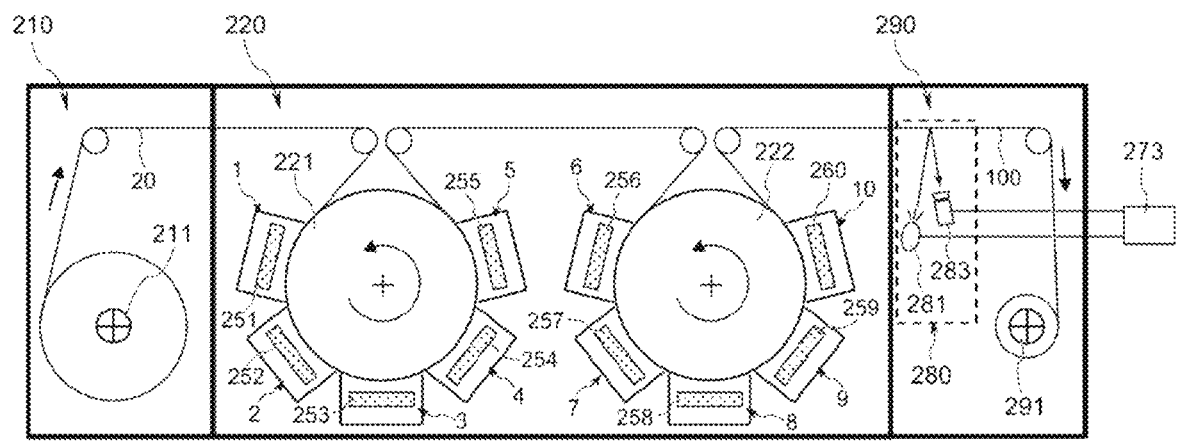
FIG. 2 is a schematic diagram illustrating a configuration example of a sputtering deposition apparatus for use in producing a multilayered optical thin-film.

FIG. 2 is a concept diagram illustrating a configuration example of the sputtering deposition apparatus. The deposition apparatus in FIG. 2 unwinds the film substrate from an unwinding roll 211 arranged in an unwinding chamber 210, supplies the unwound film substrate onto deposition rolls 221 and 222 arranged in a deposition chamber 220, and rewinds the film substrate (the optical film 100), on which the thin-films are formed, by a winding roll 291 arranged in a winding chamber 290.

The deposition chamber 220 is connected to a vacuum pump, and is adjustable to a predetermined degree of vacuum. In the deposition chamber 220, the first deposition roll 221 and the second deposition roll 222 are provided. Sputtering chambers 1 to 5 defined by partition walls are arranged along a circumferential direction of the first deposition roll 221, and sputtering chambers 6 to 10 defined by partition walls are arranged along a circumferential direction of the second deposition roll 222. Cathodes 251 to 260 are arranged respectively in the respective sputtering chambers 1 to 10, and the targets are disposed on the respective cathodes so as to face the deposition rolls.

Between the second deposition roll 222 and the winding roll 291, provided is an optical measuring unit 280 for measuring optical properties such as a reflectance and transmittance of an optical film, thus making it possible to measure the optical properties such as the transmittance and reflectance of the stacked body in which the optical thin-films are disposed on the film substrate. The optical measuring unit 280 is used for measuring the thickness in the preliminary deposition as well as for monitoring optical properties of products in the main deposition. A reflection optical system is suitable for measuring the thickness.

Reflected light detected by a light detecting unit 283 is converted into an electrical signal by a light receiving element, and is arithmetically operated by an arithmetic operation unit 273 as necessary. In the arithmetic operation unit, a spectrum of the reflected light thus detected is calculated, the reflected light is converted into a specific color system (for example, the XYZ color system, the L*a*b* color system, the Yab color system), the thickness is calculated, and so on.

Preferably, the optical measuring unit 280 is configured to be capable of measuring optical properties of a plurality of positions in the width direction of the film. Methods for measuring the optical properties of the plurality of positions in the width direction include: arranging a plurality of light detecting units in the width direction; and constituting a measuring head equipped with a light detecting unit so as to be movable in the width direction.

<Sputtering Chamber>

The sputtering method in the sputtering chamber may be bipolar sputtering method, tripolar sputtering method or magnetron sputtering method. The magnetron sputtering method is preferable because of high deposition rate. Particularly in the magnetron sputtering method, the dual magnetron sputtering method is suitable for forming a dielectric thin-film. Either of a direct current or an alternating current may be used as a power supply for applying a voltage to the targets. A direct current power supply is preferable because of high deposition rate.

Sputtering deposition of an oxide thin-film can be carried out by either of a method of using oxide targets and reactive sputtering using metal targets. For deposition of a dielectric thin-film such as the silicon oxide, reactive sputtering using a metal target is suitable since high-rate deposition can be performed. In the reactive sputtering, an inert gas such as argon and a reactive gas such as oxygen are introduced into the sputtering chamber, and an introduction amount of the reactive gas is controlled so that a transition region between a metal region and an oxide region is established, whereby the oxide thin-film can be deposited at a high rate.

In the reactive sputtering, it is preferable to control the introduction amount of the reactive gas such as oxygen by a plasma emission monitor (PEM) control. In the PEM control, plasma emission intensity at the sputtering deposition is sensed, and the introduction amount of the reactive gas is adjusted so that the emission intensity becomes a predetermined control value (a set point: SP). The gas introduction amount is automatically adjusted so that the plasma emission intensity becomes constant, whereby the transition region is kept to make it possible to carry out the deposition at a high rate, and in addition, the deposition rate can be kept constant. However, when the deposition is carried out continuously for a long time, the deposition rate is changed due to an influence of erosion and the like of the targets even if the plasma emission intensity is unchanged. Therefore, when a long-time continuous deposition is carried out, for example, in the main deposition, it is preferable to appropriately adjust SP of the PEM on the basis of the in-line measurement results of the optical properties.

Figure 3:
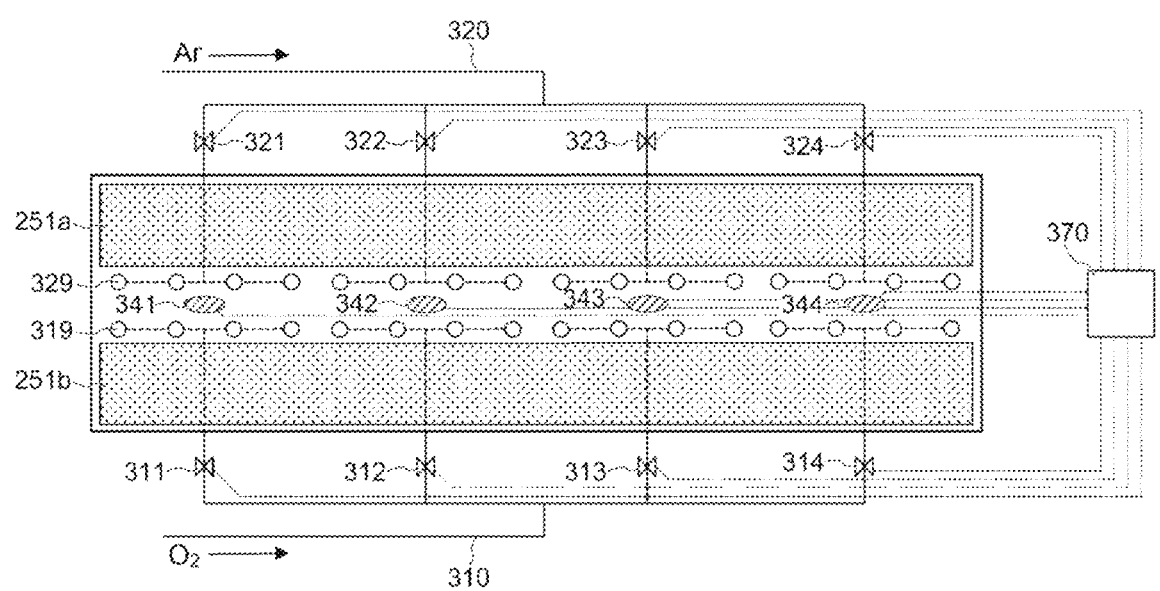
FIG. 3 is a configuration concept diagram of an inside of a sputtering chamber.

FIG. 3 is a configuration concept diagram of an inside of the sputtering chamber. A pair of targets 251*a* and 251*b* are installed on the cathode in the sputtering chamber. Gas introduction pipes 310 and 320 are connected to the sputtering chamber for supplying the inert gas such as argon and the reactive gas such as oxygen. The reactive gas introduction pipe 310 branches on the way, and mass flow controllers 311 to 314 are provided respectively on respective branch pipes. The inert gas introduction pipe 320 also branches on the way, and mass flow controllers 321 to 324 are provided respectively on respective branch pipes.

The respective mass flow controllers are connected to a control unit 370, and control flow rates of the gas introduced into the sputtering chamber. This configuration makes it possible to individually adjust the gas introduction amounts at the plurality of positions in the width direction. The branch pipes further branch downstream of the mass flow controllers, and the gases are introduced into the sputtering chamber from gas injection nozzles 319 and 329 arranged on the peripheries of the targets side by side along the width direction. Note that, though FIG. 3 illustrates a mode of introducing the reactive gas and the inert gas into the sputtering chamber individually from the gas injection nozzles 319 and 329, the reactive gas and the inert gas may be mixed with each other in advance, and may be introduced into the sputtering chamber from the same gas injection nozzle.

In the vicinities of the targets in the sputtering chamber, a plurality of PEMs 341 to 344 for sensing the plasma emission intensity of the sputtering discharge is arranged along the width direction. The PEMs 341 to 344 are connected to the control unit 370.

In order to control a state of the sputtering deposition in each sputtering chamber, the plasma emission intensity is always monitored by PEMs, and the introduction amount of the gas into the sputtering chamber is subjected to a feedback control based on the control value (the set point: SP) of the emission intensity, which is set within a predetermined range. The plurality of PEMs arranged in the width direction is capable of setting the set points independently of one another, and a balance between flow rates of the gas introduced to positions in the width direction, which correspond to the PEMs, is adjusted, whereby a thin-film having a uniform thickness in the width direction can be formed.

[Method for Producing Optical Film]

In the present invention, as described above, the multilayered optical thin-film is deposited on the film substrate using the roll-to-roll sputtering apparatus including the optical measuring unit upstream of the winding roll. The production method according to the present invention includes: a preliminary deposition step for setting the deposition conditions of the thin-film to be deposited on the film substrate; and a main deposition step for obtaining the optical film by forming the multilayered optical thin-film on the film substrate on the basis of the deposition conditions set in the preliminary deposition step.

In the preliminary deposition step, at least one adjustment step is carried out as a sub-step. In the one adjustment step, a discharging or non-discharging state in each of the sputtering chambers to be energized is maintained. After the one adjustment step is ended, the sputtering chamber to be energized is changed, and a next adjustment step is carried out. In the present invention, in the at least one adjustment step in the preliminary deposition, two or more sputtering chambers are energized simultaneously, and thin-films of two or more different materials are deposited by sputtering on the film substrate. For the film substrate subjected to the sputtering deposition of the two or more thin-films, the optical properties thereof are measured by the optical measuring unit 280 before the film substrate concerned is rewound by the winding roll 291. Thicknesses of the two or more thin-films are calculated on the basis of results of an optical measurement, and the deposition conditions in the two or more sputtering deposition chambers are adjusted on the basis of results of the calculation.

As described above, in the adjustment step, the sputtering deposition is carried out while the film substrate is conveyed, and in a state where the deposition is continued, the optical measurement, the thickness calculation, and the adjustment of the deposition conditions are repeated, whereby the thickness is adjusted within the set range. This adjustment step is carried out for all the sputtering chambers, and sputtering deposition conditions for the main deposition are set, and thereafter, the main deposition is carried out.

Hereinafter, the method for setting the deposition conditions in the preliminary deposition will be further detailed with reference to the production example of the anti-reflection film 100 illustrated in FIG. 1. The anti-reflection film 100 in FIG. 1 is obtained by sequentially depositing the following layers on the film substrate 20 by roll-to-roll sputtering: $SiO_x$ (x<2) adhesion enhancement layer 30 having a thickness of 3.5 nm; $Nb_2O_5$ high-refractive-index layer 51 having a thickness of 12 nm; $SiO_2$ low-refractive-index layer 52 having a thickness of 28 nm; $Nb_2O_5$ high-refractive-index layer 53 having a thickness of 102 nm; and $SiO_2$ low-refractive-index layer 54 having a thickness of 84 nm.

First, the main deposition step in the method for producing this anti-reflection film will be described. In the sputtering chamber 1, the $SiO_x$ adhesion enhancement layer 30 is deposited using an Si target while argon and oxygen are introduced thereinto. In the sputtering chamber 2, the $Nb_2O_5$ layer 51 is deposited using Nb target while argon and oxygen are introduced thereinto. In the sputtering chamber 3, the $SiO_2$ layer 52 is deposited using Si target while argon and oxygen are introduced thereinto. In the sputtering chambers 4 to 7, the $Nb_2O_5$ layer 53 is deposited using Nb targets while argon and oxygen are introduced thereinto. The $Nb_2O_5$ layer 53 has a larger thickness than the $SiO_2$ layer 52 and the $Nb_2O_5$ layer 51, and accordingly, in the present embodiment, four sub-thin-films 53a, 53b, 53c and 53d are deposited in the sputtering chambers 4 to 7. In That is, the $Nb_2O_5$ layer 53 is a stacked film of the sub-thin-films 53a, 53b, 53c and 53d deposited in the four sputtering chambers. In a similar way, the $SiO_2$ layer 54 is a stacked film of sub-thin-films 54a, 54b and 54c, which are deposited in the three sputtering chambers 8 to 10.

In the preliminary deposition step performed before the main deposition, deposition conditions for the four thin-films 51 to 54 which constitute the anti-reflection layer 50 (that is, deposition conditions of the sputtering chambers 2 to 10) are adjusted. It is not always necessary to adjust the deposition conditions for the adhesion enhancement layer 30 deposited in the sputtering chamber 1. Therefore, it is not always necessary to deposit the adhesion enhancement layer in the preliminary deposition. Table 1 shows a list of relationships between layer configurations of the thin-films in the present embodiment and the sputtering chambers for use in the deposition of the respective sub-thin-films. Numbers of the thin-films in Table 1 correspond to reference numerals in FIG. 1, and numbers of the sputtering chambers in Table 1 correspond to reference numerals in FIG. 2.

TABLE 1

| Sputtering chamber | 1 | 2 | 3 | 4 | 5 | 6 | 7 | 8 | 9 | 10 |
|---|---|---|---|---|---|---|---|---|---|---|
| Target | Si | Nb | Si | Nb | Nb | Nb | Nb | Si | Si | Si |
| Thin-film | 30 | 51 | 52 | 53a | 53b | 53c | 53d | 54a | 54b | 54c |
| | | | | | 53 | | | | 54 | |
| | $SiO_x$ | $Nb_2O_5$ | $SiO_2$ | | $Nb_2O_5$ | | | | $SiO_2$ | |
| Thickness (nm) | 3.5 | 12 | 28 | | 102 | | | | 84 | |
| Condition adjustment | No | Yes | Yes | | Yes | | | | Yes | |

<Conventional Preliminary Deposition Method>

First, a description will be given of a conventional preliminary deposition method of forming a single-layer thin-film and adjusting a thickness and deposition conditions thereof. FIGS. 4A to 4C illustrate states of the sputtering chambers (that is, whether the sputtering chambers are energized) in the respective adjustment steps of the thickness adjustment method in the preliminary deposition of the conventional technology. The preliminary deposition step in FIG. 4A is composed of five sub-steps S611 to S615. In the adjustment steps S611 to S614, the single-layer thin-film is formed, and the deposition conditions are adjusted, and in step S615, the deposition conditions for all the thin-films are adjusted as necessary.

In the first adjustment step S611, only the sputtering chamber 2 is energized while the film substrate is continuously conveyed at a speed v611, and the niobium oxide layer 51 is deposited by sputtering on the film substrate. On the basis of the measurement results by the optical measuring unit, the thickness of the niobium oxide layer 51 in the stacked body in which the niobium oxide layer is deposited on the film substrate is calculated. For example, a reflection spectrum is measured in the optical measuring unit, and an optical thickness of the niobium oxide layer 51 is calculated on the basis of a peak wavelength of the reflectance. The calculation of the thickness based on the reflection spectrum utilizing the fact that a thin-film having an optical thickness of nd has a peak of a reflectance at a wavelength $\lambda=2nd/m$ (m is an integer of 1 or more, n is a refractive index, and d is a physical thickness).

Even if the film substrate is conveyed at a conveyance speed V similar to that in the main deposition, and a niobium oxide thin-film having a thickness of 12 nm (refractive index n=2.33; optical thickness: 28 nm) is deposited thereon, the peak of the reflectance does not appear at a longer wavelength than a wavelength of 56 nm. Therefore, in the adjustment step S611, in order to obtain the thickness of the niobium oxide thin-film, it is necessary to increase a deposition thickness by conveying the film substrate at the conveyance speed v611 that is approximately ⅛ or less of the conveyance speed V of the film substrate in the main deposition so that the reflection peak wavelength of the niobium oxide thin-film appears in the visible light region.

When the conveyance speed v611 in the first adjustment step is ⅛ of the conveyance speed V in the main deposition, the peak wavelength of the reflectance is observed at around a wavelength of 448 nm if the deposition conditions are appropriate and the niobium oxide thin-film has an optical thickness of approximately 224 nm. When the peak wavelength of the reflectance measured by the optical measuring unit deviates from this range, the voltage applied to the targets and the amount of oxygen introduced into the sputtering chamber are changed, whereby the deposition conditions are adjusted. The optical measurement, the thickness calculation (confirmation of the reflectance peak wavelength) and the adjustment of the deposition conditions are repeated, and if the overall thickness in the width direction falls within the set range (for example, if the reflectance peak wavelength is within ±15 nm of the set value), then the first adjustment step S611 is ended, and the energization to the sputtering chamber is cut off.

In the second adjustment step S612, while the film substrate is continuously conveyed at a speed v612, the sputtering chamber 3 is energized to deposit the silicon oxide layer 52 by sputtering, and optical measurement, the thickness calculation and the adjustment of the deposition conditions are repeated until the overall thickness of the silicon oxide layer 52 in the width direction falls within the set range. The silicon oxide layer 52 and the niobium oxide layer 51 have optical thicknesses different from each other. Therefore, in the second adjustment step S612, in order that the silicon oxide layer has a reflectance peak in the visible light region, the deposition conditions for the silicon oxide layer are adjusted while the film substrate is conveyed at the conveyance speed v612 different from that in the first adjustment step.

After the second adjustment step S612 is ended, the energization to the sputtering chamber 3 is cut off, the sputtering chambers 5, 6, 7 and 8 are energized, and the third adjustment step S613 is performed. In the adjustment step S613, while the film substrate is conveyed at a conveyance speed v613, the deposition conditions for the sub-thin-films 53a, 53b, 53c and 53d are adjusted until the thickness of the niobium oxide layer 53 falls within the set range.

Only by the measurement of the reflection peak wavelength, the thickness of each of the sub-thin-films 53a, 53b, 53c and 53d cannot be calculated. Therefore, in the third adjustment step S613, the deposition conditions in the sputtering chambers 4 to 7 are adjusted simultaneously, and condition adjustment is performed so that a total thickness of the four sub-thin-films falls within the set range. Alternatively, as in the adjustment step S623 in FIG. 4B, the deposition conditions for any one of the sputtering chambers 4 to 7 are adjusted, and the other three sputtering chambers continue the deposition under fixed conditions, whereby the adjustment is performed so that the total thickness falls within the set range.

Thereafter, the energization to the sputtering chambers 4 to 7 is cut off, the sputtering chambers 8 to 10 are energized, and the fourth adjustment step S614 is performed. In the adjustment step S614, while the film substrate is conveyed at a conveyance speed v614, the deposition conditions for the sub-thin-films 54a, 54b and 54c are adjusted until the thickness of the silicon oxide layer 54 falls within the set range.

As described above, in the adjustment steps S611 to S614, the deposition conditions are adjusted for each of the thin-films 51 to 54 each of which is composed of the single material. Thereafter, in step S615, all the sputtering chambers 1 to 10 are energized, the film substrate is conveyed at the same conveyance speed v615 as the conveyance speed V in the main deposition, and the anti-reflection layer composed of the multilayered optical thin-film is formed on the film substrate. When a spectrum shape (a reflection bottom wavelength) and a hue measured by the optical measuring unit is deviate from the set values, the deposition conditions are further adjusted. The main deposition for obtaining the product is carried out after it is confirmed that the spectrum of the desired anti-reflection layer is obtained.

In the modes shown in FIG. 4A and FIG. 4B, the deposition conditions for the single-layer thin-film are adjusted for each of the four adjustment steps, and thereafter, the deposition conditions for the multilayered optical thin-film are adjusted in the fifth adjustment step. In this method, it is necessary to reduce the conveyance speed of the film substrate in the adjustment steps of the preliminary deposition so that the single-layer thin-film has the peak wavelength of the reflection spectrum in the visible light region. In addition, since the optical thicknesses of the single-layer thin-films for which the deposition conditions are to be adjusted differ from one another according to the adjustment steps, it is necessary to change the conveyance speed of the film substrate for each of the adjustment steps.

In steps S613 and S614 in FIG. 4A (as well as steps S623 and S624 in FIG. 4B), the adjustment of the deposition conditions based on the total thickness of the plurality of sub-thin-films is only performed, and the adjustment of the thickness of each of the sub-thin-films individually is not performed. Therefore, in some cases, it takes a lot of time to set the conditions for uniforming the thickness in the width direction. Moreover, even if the total thickness of the plurality of sub-thin-films is uniform in the width direction, each of the sub-thin-films may have a thickness distribution in the width direction. When each sub-thin-film has the thickness distribution in the width direction, the thickness distribution in the width direction may be increased due to a slight change of the deposition environment. Therefore, when the deposition is performed by energizing all the sputtering chambers, correcting the deviation of the thickness is difficult, and accordingly, it takes a long time to adjust the conditions in the adjustment step S615 (or S625), or the thickness distribution in the width direction is increased in the main deposition, which may cause an occurrence of a defective product with quality out of specification.

The problem of the nonuniformity of the thickness of each sub-thin-film can be solved if the deposition conditions are adjusted for each of the sub-thin-films in the adjustment steps S631 to S639, as shown in FIG. 4C, so that the thicknesses fall within the predetermined ranges. However, in the mode shown in FIG. 4C, the number of adjustment steps is increased. Moreover, in order to set the thickness of each sub-thin-film so that the reflection peak wavelength remains in the visible light region, it is necessary to further reduce the conveyance speeds v631 to v639 of the film substrate more than in the case of forming the plurality of sub-thin-films as the single-layer thin-films as shown in FIGS. 4A and 4B. Therefore, the time required for the preliminary deposition is further lengthened, resulting in the decrease in the productivity.

<Preliminary Deposition Method of the Present Invention>

As described above, in the conventional preliminary deposition, the thicknesses are adjusted on the basis of the peak (bottom) wavelengths of the single-layer thin-films. In contrast, in the present invention, a stacked of the thin-films of two or more different materials is deposited by sputtering on the film substrate, and the thicknesses of the plurality of thin-films are calculated on the basis of optical measurement results. On the basis of a result of this calculation, the deposition conditions for the plurality of thin-films are adjusted in one adjustment step.

Specifically, the different materials are materials having different refractive indexes, and are preferably films formed by different target materials. For example, niobium oxide (refractive index: 2.33) deposited using a Nb target and silicon oxide (refractive index: 1.46) deposited using a Si target are different materials.

Figure 5:
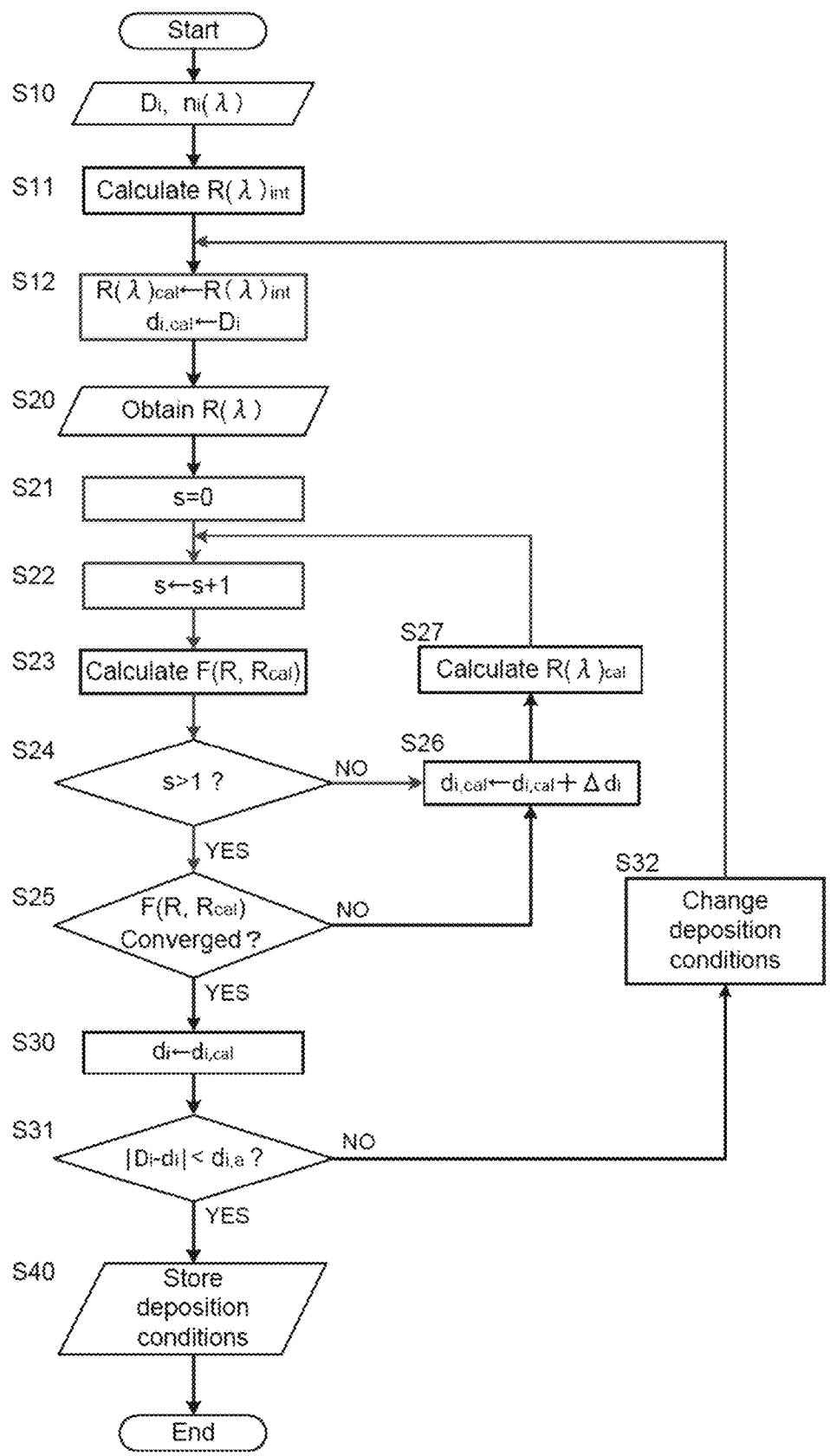
FIG. 5 is a flowchart illustrating an example of the adjustment method of the deposition conditions in the preliminary deposition.
Figure 8:
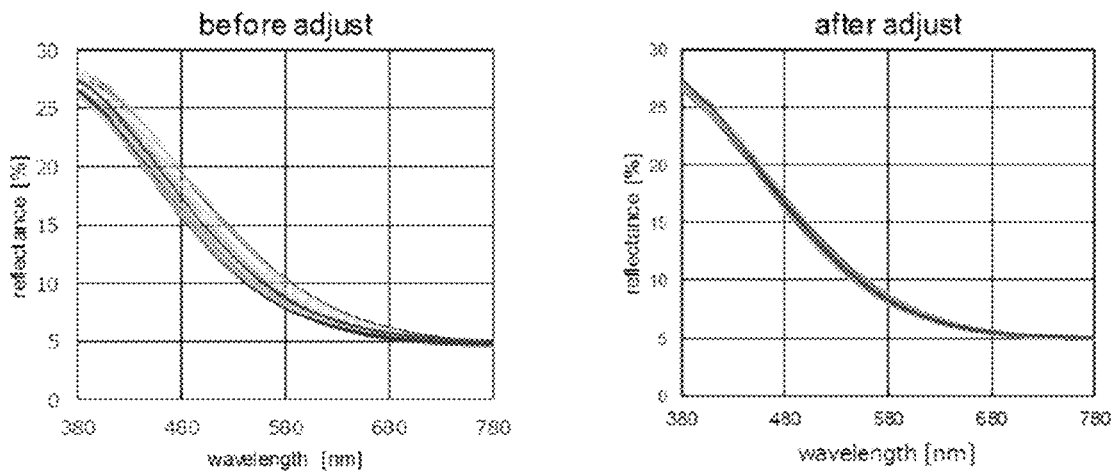
FIG. 8 shows reflection spectra at 23 positions in a width direction before and after the adjustment of the deposition conditions in the first adjustment step S151.
Figure 9:
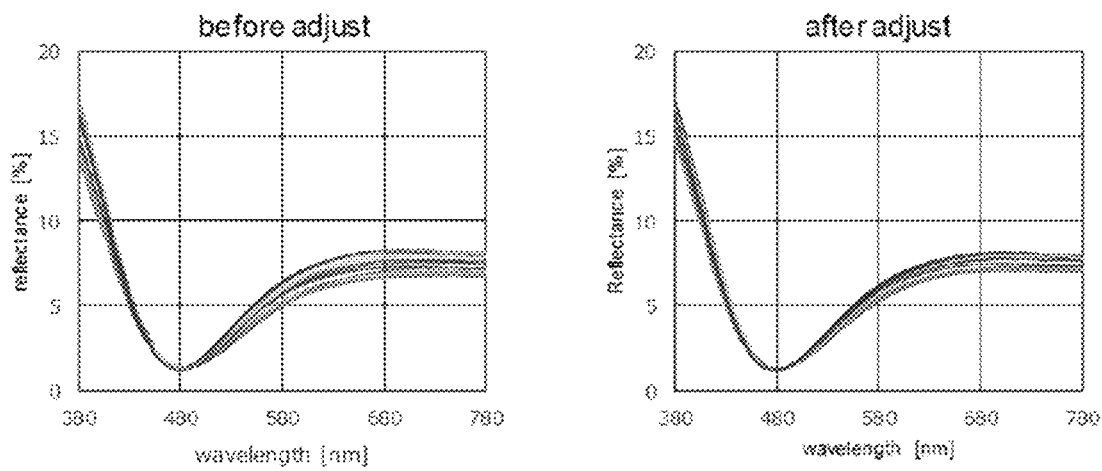
FIG. 9 shows reflection spectra at 23 positions in a width direction before and after the adjustment of the deposition conditions in the second adjustment step S152.
Figure 10:
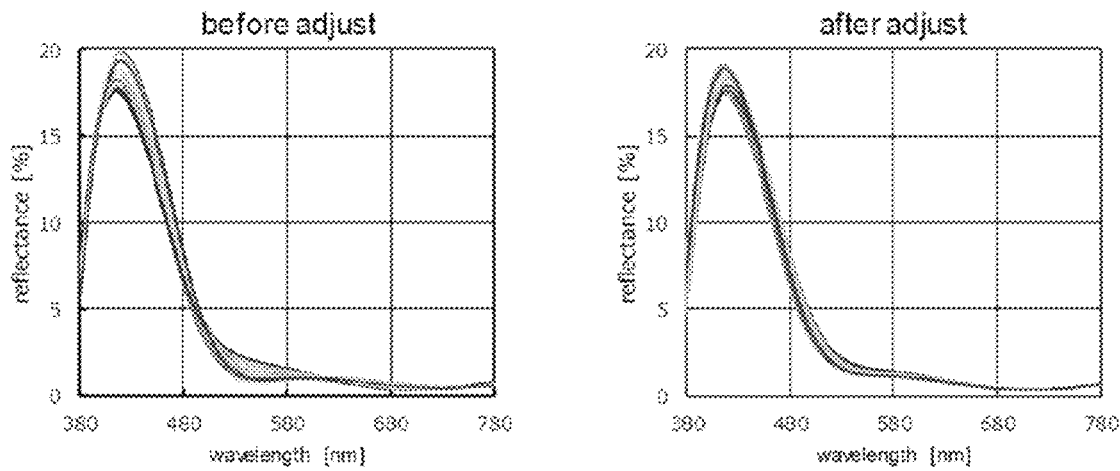
FIG. 10 shows reflection spectra at 23 positions in a width direction before and after the adjustment of the deposition conditions in the third adjustment step S153.
Figure 11:
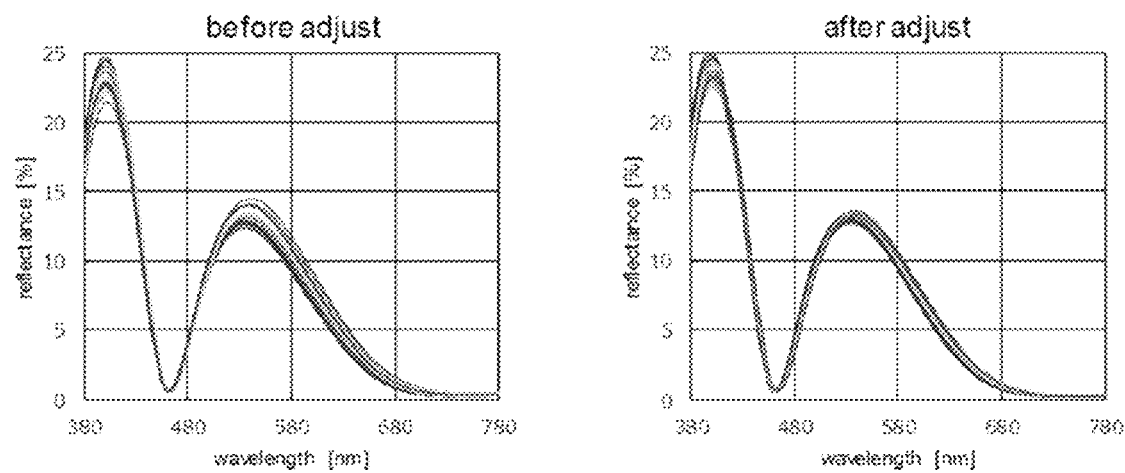
FIG. 11 shows reflection spectra at 23 positions in a width direction before and after the adjustment of the deposition conditions in the fourth adjustment step S154.

FIG. 5 is a flowchart of an example of an adjustment method (adjustment steps) of deposition conditions in the preliminary deposition of the present invention. In this embodiment, with regard to a film substrate on which m layers (m is an integer of 2 or more) of optical thin-films are formed, the deposition conditions for the respective layers are adjusted so that a difference between an in-line reflection spectrum of the film substrate and a target reflection spectrum falls within a predetermined range. Specifically, on the basis of a measurement result of the in-line reflection spectrum, a thickness $d_i$ (i is an integer of 1 to m) of each of the m-layer thin-films of the optical thin-film is calculated, the thickness $d_i$ is changed by adjusting the deposition conditions, and the in-line reflection spectrum is approximated to the target reflection spectrum.

As a method of calculating the thicknesses of the plurality of thin-films on the basis of the reflection spectrum, known methods such as the curve fitting method and the Fourier transform method can be adopted. The curve fitting method is suitable for measuring the thickness of the multilayered optical thin-film including the thin-films in nanometer order.

In the curve fitting method, a difference between a calculated reflection spectrum $R(\lambda)_{cal}$ obtained from an optical calculation model and a measured reflection spectrum $R(\lambda)$ obtained by the in-line measurement is calculated as an evaluation function $F(R, R_{cal})$. A combination of the thicknesses in the optical calculation is changed to perform repeated calculations, and combinations $(d_1, d_2 \ldots, d_m)$ of the thicknesses, in each of which the evaluation function becomes minimum, are output as calculated values (measured values) of the thickness.

Known methods for obtaining the reflection spectrum $R(\lambda)_{cal}$ of the multilayered optical thin-film by the optical calculation model include: repeatedly applying a formula of thin-film interference calculation to each of interfaces of the thin-films and summing up all of multiply reflected waves; calculating the reflection spectrum by a transfer matrix in consideration of the boundary condition of the Maxwell equation; and the like. The reflection spectrum may be obtained by any calculation method in the present invention.

Generally, in the optical calculation model of the multilayered optical thin-film, reflection on an interface between the film substrate 20 and the multilayered optical thin-film and reflection on the surface (an air interface) of the multilayered optical thin-film are taken into consideration in the calculation; however, reflection on an air interface on a back surface of the film substrate (that is, a surface on which the thin-films are not formed) is not taken into consideration. Therefore, when the film substrate 20 is a transparent film made of triacetylcellulose, polyethylene terephthalate or the like, it is necessary to add a component of reflected light on the back surface (that is, back surface reflected light component) of the film substrate to the reflectance obtained by the optical calculation for the multilayered optical thin-film. The back surface reflected light component $R_b$ is represented by the following equation:

$$R_b = \frac{T_{ff}^2 \times T_i^2 \times R_0}{1 - (T_i^2 \times R_0 \times R_{remen})}$$

where $T_{ff}$ is a transmittance on the substrate back surface, $T_i$ is an internal transmittance of the substrate, $R_0$ is a reflectance on the interface between the substrate back surface and air, and $R_{remen}$ is a reflectance on the interface between the substrate and the multilayered optical thin-film.

In adjusting the deposition conditions for the respective layers, first, a target reflection spectrum $R(\lambda)_{int}$ is obtained by the optical calculation model (S10, S11). In calculating the target reflection spectrum, a set value $D_i$ of the thickness and a refractive index $n(\lambda)_i$ in each of the m-layer thin-films is used. Since a refractive index $n(\lambda)$ of known material is already known, $n(\lambda)$, stored in a database just needs to be read for each of the thin-films. Note that, instead of calculating the target spectrum $R(\lambda)_{int}$ from the set value $D_i$ of the thickness, the set value $D_i$ of the thickness may be calculated from the already-known $R(\lambda)_{int}$ by the optical calculation.

(Thickness Calculation from Reflection Spectrum)

The deposition conditions for the respective layers are adjusted so that the measured reflection spectrum obtained by the in-line measurement are approximated to the target spectrum obtained by the optical calculation model. The difference between the measured value of the thickness and a target value thereof is evaluated for each of the plurality of thin-films, whereby the deposition conditions for the plurality of thin-films can be adjusted efficiently. The measured value of the thickness mentioned herein refers to a value of the thickness of each layer, which is calculated by the optical calculation model from the measured reflection spectrum obtained from the in-line measurement.

First, an initial calculation spectrum calculated by the optical calculation from an arbitrary thickness of each layer is set. In the present embodiment, the target reflection spectrum $R(\lambda)_{int}$ calculated from the set thickness $D_i$ of each layer is used as the initial calculation spectrum (S12).

The difference between the measured reflection spectrum $R(\lambda)$ obtained by the in-line measurement and the reflection spectrum $R(\lambda)_{cal}$ obtained by the optical calculation is calculated as the evaluation function $F(R, R_{cal})$ (S23). The evaluation function is calculated, for example, as a distance between the measured spectrum $R(\lambda)$ and the calculated spectrum $R(\lambda)_{cal}$ by the optical calculation. The distance between the two spectra can be calculated by partitioning an evaluation wavelength range into M pieces of wavelength regions and by obtaining a sum of squares of a difference between a reflectance $R(\lambda)$ (k is an integer of 1 to M) of the measured spectrum and a reflectance $R(\lambda_k)_{cal}$ of the calculated spectrum by the optical calculation in each wavelength region $\lambda_k$.

Note that, in some cases, the difference occurs between the measured value and calculated value of the reflectance due to an in-line optical measurement environment and other factors. Therefore, in calculating the evaluation function, a predetermined correction function $\beta(\lambda)$ may be subtracted from a simple difference between $R(\lambda)$ and $R(\lambda)_{cal}$ and the sum of squares may be used as in the following equation.

$$F(R, R_{cal}) = \sum_{k=1}^{M} \{R(\lambda_k) - R(\lambda_k)_{cal} - \beta(\lambda_k)\}^2$$

In the optical calculation, the reflection spectrum $R(\lambda)_{cal}$ may be obtained in consideration of the correction function. Note that the evaluation function is not limited to the above. As long as a magnitude of a difference between two spectra can be determined, any function can be used as the evaluation function, and it is recommended to employ a function having a high convergence rate by repeated calculations and capable of shortening a calculation time, according to the spectrum shape, etc.

After the evaluation function is calculated on the basis of the reflection spectrum $R(\lambda)_{cal}$ by the optical calculation and the measured reflection spectrum, a thickness $d_{i,cal}$ is changed (S26), and the reflection spectrum $R(\lambda)_{cal}$ is recalculated on the basis of the changed thickness $d_{i,cal}$ (S27). An evaluation function $F(R, R_{cal})$ is calculated on the basis of the recalculated reflection spectrum $R(\lambda)_{cal}$ and the measured reflection spectrum $R(\lambda)$, and the previous (s−1-th) evaluation function and this-time (s-th) evaluation function are compared with each other. On the basis of a variation of the evaluation function, a change amount $\Delta d_i$ of the thickness $d_{i,cal}$ is determined, and the thickness $d_{i,cal}$ is changed (S26), and on the bases of the changed thickness $d_{i,cal}$, the reflection spectrum $R(\lambda)_{cal}$ is recalculated (S27). The above is repeated, and when it is determined that the evaluation function $F(R, R_{cal})$ converges, the calculation is ended.

Note that the calculation method of the thickness is not limited to the above, and the thickness may be calculated using a general-purpose optical simulation program or a thickness calculation program.

(Adjustment of Deposition Conditions)

The thickness $d_{i,cal}$ of the thin-film calculated on the basis of the reflection spectrum in the in-line measurement is output as a measured value $d_i$ of a thickness of an i-th layer (S30). A difference between the measured value $d_i$ of the thickness of each layer and the thickness $D_i$ of each layer, which corresponds to the target reflection spectrum $R(\lambda)_{int}$, is calculated (S31). If the calculated difference is within a permissible range, the deposition conditions (the set point of the PEM, the voltage and the like) for the i-th layer are stored as deposition conditions for the main deposition (S40), and the adjustment is ended. Instead of using the difference of the thickness as a criterion to determine whether to end the adjustment, a difference between the measured reflection spectrum $R(\lambda)$ obtained by the in-line measurement and the target spectrum $R(\lambda)_{int}$ may be used as a determination criterion. The difference between the reflection spectra can be evaluated, for example, on the basis of the above-mentioned evaluation function.

When the difference between the set thickness $D_i$ and the thickness $d_i$ (or the difference between the reflection spectra) is out of the range, the thickness is adjusted by changing the deposition conditions. The adjustment is repeatedly carried out until a difference between the thicknesses of the respective layers (or a difference between the reflection spectra) after the deposition conditions falls within the permissible range. In order to eliminate fluctuations of the thickness in the width direction, the deposition conditions are adjusted at a plurality of positions in the width direction in consideration of the thickness distribution obtained from the measurement results of the reflection spectra at the plurality of positions in the width direction.

The adjustment of these deposition conditions may be manually operated by an operator, or may be adjusted automatically. For example, in the case of adopting the PEM control for adjusting the introduction amount of the reactive gas so that the emission intensities in the plurality of plasma emission monitors 341 to 344 arranged along the width direction fall within the predetermined range, the PEM control value (the set point: SP) is changed so that the difference between the measured value and the set value (the target value) is reduced, whereby the deposition conditions are adjusted.

As described above, in the method of the present invention, the thicknesses of the plurality of thin-films which constitute the multilayer thin-film are individually calculated, whereby the deposition conditions for the plurality of thin-films can be adjusted simultaneously by one adjustment step. Accordingly, the number of adjustment steps in the preliminary deposition can be reduced. By reducing the number of adjustment steps, the time taken to adjust the deposition conditions can be shortened, in addition, a time taken to switch the adjustment steps can also be shortened. Particularly, in the sputtering deposition, discharge tends to be unstable immediately after the start of the energization, and measurement of the thicknesses or adjustment of the deposition conditions cannot be performed until the discharge is stabilized. As the number of adjustment steps is reduced, the number of on/off times of the energization in each of the sputtering chambers during the preliminary deposition is also reduced. Accordingly, the reduction in the number of adjustment steps greatly contributes to the shortening of the time of the preliminary deposition. Moreover, in the method of the present invention, the deposition conditions are adjusted using the optical measurement data such as the reflection spectrum so that the measured spectrum and thickness are approximated to the target values, and accordingly, it is easy to reduce the fluctuations of the optical properties.

Specific Example of Adjustment Steps

FIGS. 6A to 6D are tables for explaining embodiments of the preliminary deposition in the present invention, showing states of the respective sputtering chambers in the adjustment steps. In a mode shown in FIG. 6A, in one adjustment step S101, all the sputtering chambers are energized, and the deposition conditions for all the four thin-films which constitute the anti-reflection layer are adjusted. In the adjustment step S101, all the sputtering chambers 1 to 10 are energized while the film substrate is continuously conveyed at a speed v101, and the following five layers are deposited on the film substrate: the adhesion enhancement layer 30, the niobium oxide layer 51, the silicon oxide layer 52, the niobium oxide layer 53 and the silicon oxide layer 54. In the optical measuring unit, the reflection spectrum of the stacked body in which the multilayered optical thin-film is deposited on the film substrate is measured, and the thickness of each of the four thin-films 51 to 54 which constitute the anti-reflection layer 50 is calculated based on the reflectance spectrum.

The thicknesses of the thin-films 51, 52, 53 and 54 calculated from the reflection spectrum are compared with the set values of the thicknesses, and the deposition conditions for the sputtering chambers corresponding to the thin-films in which the differences of the thicknesses occur are adjusted, whereby the deposition conditions for all the thin-films can be adjusted in one adjustment step. In this case, reflection spectra are measured at the plurality of positions in the width direction, and the SPs of the PEMs are adjusted at the plurality of positions in the width direction in response to the thickness distribution, whereby the thickness distribution in the width direction is reduced, and the uniformity can be enhanced.

The conveyance speed v101 of the film substrate in the adjustment step S101 may be the same as or different from the conveyance speed V of the film substrate in the main deposition. When both of the conveyance speeds v101 and V are different from each other, the set values of the thicknesses in the adjustment step just need to be determined in response to a ratio (V/v101) of the conveyance speeds.

After the adjustment of the deposition conditions is completed, the main deposition for acquiring the product is carried out. When the conveyance speed v101 of the film substrate in the adjustment step S101 of the preliminary deposition and the conveyance speed V in the main deposition are different from each other, the conveyance speed of the film substrate is changed after the adjustment of the deposition conditions is completed, and the main deposition is started thereafter. After the conveyance speed is changed, the reflection spectrum of the optical film (anti-reflection film) is confirmed, and the deposition conditions are finely adjusted as necessary, and thereafter, the main deposition (product acquisition) may be started.

In the embodiment shown in FIG. 6A, the sputtering chamber 1 is energized to form the adhesion enhancement layer during the preliminary deposition. However, as in an embodiment shown in FIG. 6B, the adhesion enhancement layer does not have to be formed in the preliminary deposition. As in an embodiment shown in FIG. 6C, the deposition conditions may be adjusted without forming the adhesion enhancement layer in the adjustment steps S121 to S126 of the preliminary deposition, and the adhesion enhancement layer may be formed in step S127, which is carried out before starting the main deposition.

The film substrate used in the preliminary deposition may be the same as or different from the film substrate used in the main deposition. When the same film substrate is used in the preliminary deposition and the main deposition, the main deposition can be carried out subsequently to the preliminary deposition while the energization to the sputtering chamber is maintained, and accordingly, production efficiency can be enhanced. In the case of using different film substrates between the preliminary deposition and the main deposition, the film substrate is switched to the film substrate for the main deposition after the deposition conditions are adjusted in the adjustment step S101, and then the energization is resumed to perform the main deposition.

FIG. 6B is a table regarding another embodiment of the preliminary deposition. In a mode shown in FIG. 6B, the number of sputtering chambers to be energized is increased every adjustment step, and the deposition conditions for the sputtering chamber for which the energization is newly started are adjusted, whereby the deposition conditions for all the sputtering chambers are individually set.

First, in an adjustment step S111, the sputtering chambers 2, 3 and 4 are energized, and the deposition conditions for the niobium oxide layer 51 in the sputtering chamber 2, the deposition conditions for the silicon oxide layer 52 in the sputtering chamber 3 and the decomposition conditions for the niobium oxide layer 53a in the sputtering chamber 4 are adjusted. Although the niobium oxide layer 51 and the niobium oxide layer 53a have the same refractive index, the silicon oxide layer 52 having a different refractive index is deposited between both of the niobium oxide layers, and accordingly, the thicknesses of these three thin-films can be individually calculated on the bases of the in-line measurement results of the reflection spectrum.

The thicknesses of the thin-films 51, 52 and 53a calculated from the reflection spectrum are compared with the set values of the thicknesses, and the deposition conditions for the sputtering chambers corresponding to the thin-films in which the deviations of the thicknesses occur are adjusted. When the thicknesses of the plurality of thin-films in the thin-films 51, 52 and 53a deviate from the set values, the deposition conditions for the plurality of sputtering chambers corresponding to these may be adjusted simultaneously, or after setting of the deposition conditions for one sputtering chamber is completed, the deposition conditions for the other sputtering chambers may be adjusted. A conveyance speed v111 of the film substrate in the adjustment step S111 may be the same as or different from the conveyance speed V of the film substrate in the main deposition.

A total of the optical thickness (2.33×12=28 nm) of the niobium oxide layer 51, the optical thickness (1.46×28=41 nm) of the silicon oxide layer 52 and the optical thickness (2.33×102/4=59 nm) of the niobium oxide sub-thin-film 53a is 128 nm. Accordingly, the thickness of any of the single-layer films and the stacked film cannot be calculated from the peak wavelength of the reflection spectrum of the visible light.

In contrast, by calculating thicknesses from spectral waveforms (i.e., function of the reflectance with respect to the wavelength), the thicknesses of the plurality of thin-films can be individually calculated even if neither the peak wavelength nor the bottom wavelength is present in a measurement wavelength region (visible light region). Therefore, in the method of the present invention, the film substrate conveyance speed v111 in the adjustment step S111 may be the same as the film substrate conveyance speed V in the main deposition. Even if the conveyance speed v111 in the adjustment step S111 is different from the conveyance speed V in the main deposition, it is not necessary to consider the peak wavelengths of the reflection spectrum, and the like. Accordingly, the method of the present invention has a high degree of freedom in selecting the substrate conveyance speed in the preliminary deposition.

After the deposition conditions for the sputtering chambers 2, 3 and 4 are adjusted in the adjustment step S111, the energization to the sputtering chamber 5 is started in an adjustment step S112 while the energization to these sputtering chambers is maintained. In the adjustment step S112, the deposition conditions for the niobium oxide layer 53b in the sputtering chamber 5 to which the energization is newly started are adjusted.

By the in-line measurement of the reflection spectrum, the thicknesses of the niobium oxide layer 51, the silicon oxide layer 52 and the niobium oxide layer (a stack of the sub-thin-film 53a and the sub-thin-film 53b) are calculated. In such a thickness measurement based on the reflection spectrum, the thickness (a total thickness of the sub-thin-films 53a and 53b) of the niobium oxide layer is calculated, and the thickness of the sub-thin-film 53b cannot be individually obtained. Meanwhile, for the niobium oxide layer 51, the silicon oxide layer 52 and the niobium oxide sub-thin-film 53a, the deposition conditions are adjusted in the previous adjustment step S111 such that the thicknesses thereof are the set values. Accordingly, the thicknesses of these thin-films are already known. Since the thickness of the niobium oxide sub-thin-film 53a is already known, the thickness of the niobium oxide sub-thin-film 53b can be calculated from a difference between the thickness of the niobium oxide layer and the thickness of the sub-thin-film 53a.

As described above, the deposition conditions for the thin-film for which the deposition conditions are adjusted in the previous adjustment step are fixed, and the thickness measurement and the adjustment of the deposition conditions are carried out for the thin-film for which the deposition is newly started. In this way, the deposition conditions for the plurality of sub-thin-films 53a and 53b can be individually adjusted, and not only the total thickness of the stacked film but also the thickness of each of the sub-thin-films in the width direction can be uniformed.

A conveyance speed v112 of the film substrate in the adjustment step S112 may be the same as or different from the conveyance speed v111 of the film substrate in the previous adjustment step S111. It is preferable that the conveyance speeds v111 and v112 of the film substrate in the adjustment steps S111 and S112 are the same, since values of the thicknesses in the previous adjustment step can be directly used and a deposition environmental change associated with a change of the conveyance speed can be suppressed. Preferably, conveyance speeds v113 to v116 in adjustment steps S113 to S116 performed after the adjustment step S112 are also the same as v111 and v112.

In the adjustment step S113, the energization to the sputtering chamber 6 is newly started and the deposition conditions for the niobium oxide layer 53c are adjusted while the energization to the sputtering chambers 2 to 5 is maintained.

In the adjustment step S114, the energization to the sputtering chamber 7 and 8 is newly started and the deposition conditions for the niobium oxide layer 53d and the silicon oxide layer 54a are adjusted while the energization to the sputtering chambers 2 to 6 is maintained. Thereafter, in the adjustment steps S115 and S116, the energization to the sputtering chamber 9 and the energization to the sputtering chamber 10 are started respectively, and the deposition conditions for the silicon oxide layers (the sub-thin-films) 54b and 54c are adjusted.

As described above, in the present embodiment, the deposition conditions for the nine sputtering chambers can be individually adjusted by the six adjustment steps. By individually adjusting the thicknesses of the respective sub-thin-films, the multilayered optical thin-film excellent in thickness uniformity can be deposited. In the conventional technology, in order to individually adjust the deposition conditions for the nine sputtering chambers, nine adjustment steps, the number of which is the same as the number of sputtering chambers, are required as shown in FIG. 4C. In contrast, in the method of the present invention, since the deposition conditions for the plurality of thin-films are adjusted by one adjustment step, the number of adjustment steps in the preliminary deposition can be reduced.

Note that, in the present invention, the deposition conditions for the plurality of thin-films just need to be adjusted in any one of the adjustment steps in the preliminary deposition, and the deposition conditions for the plurality of thin-films do not always have to be adjusted in all the adjustment steps. A step of adjusting the thickness of one thin-film, like each of steps S112, S113 and S115 in FIG. 6B, may be included.

After the deposition conditions for all the sputtering chambers are adjusted, in step S117, the film substrate is conveyed at the same conveyance speed V as that for the main deposition, and it is confirmed whether the spectrum shape and hue of the reflected light deviate from the set values (design values). When the measured values deviate from the set values, the deposition conditions are further adjusted, and it is confirmed that the spectrum of the desired anti-reflection layer is obtained. Thereafter, the sputtering chamber 1 for depositing the adhesion enhancement layer is energized, and the main deposition for obtaining the product is carried out.

In the embodiment shown in FIG. 6B, while the energization to the sputtering chambers for which the deposition conditions have already been adjusted in the previous adjustment steps is maintained, the energization to the sputtering chamber for which the deposition conditions are to be adjusted is started in the next adjustment step. In another embodiment, the energization to the sputtering chamber for which the deposition conditions are already adjusted is stopped, and the adjustment step is performed in a state of energizing only the sputtering chamber for which the deposition conditions are to be adjusted.

For example, in the embodiment shown in FIG. 6C, in the first adjustment step S121, the sputtering chambers 2 to 4 subjected to the adjustment are energized, and the deposition conditions for these sputtering chambers are adjusted. In the next adjustment step S122, the energization to the sputtering chambers 2 to 4 is stopped, and only the sputtering chamber 5 is energized, and the deposition conditions therefor are adjusted. In the subsequent adjustment step S123, only the sputtering chamber 6 is energized, and the deposition conditions therefor are adjusted. In the adjustment step S124, the sputtering chambers 7 and 8 are energized, and the deposition conditions therefor are adjusted. In the adjustment steps S125 and S126, the sputtering chambers 9 and 10 are energized respectively, and the deposition conditions therefor are adjusted.

The deposition conditions for the nine sputtering chambers are individually adjusted by the six adjustment steps as described above. Thereafter, in step S127, the film substrate is conveyed at the same conveyance speed V as that for the main deposition, the sputtering chambers 1 to 10 are energized, and it is confirmed whether the spectrum shape and hue of the reflected light deviate from the set values (design values). When the measured values deviate from the set values, the deposition conditions are further adjusted, and it is confirmed that the spectrum of the desired anti-reflection layer is obtained. Thereafter, the main deposition for obtaining the product is carried out.

In this embodiment, in the adjustment steps S121 to S126, the sputtering chambers for which the deposition conditions (the thicknesses) are not to be adjusted are not energized, and accordingly, consumptions of the target materials in the preliminary deposition can be reduced. Meanwhile, as in the embodiment shown in FIG. 6B, if the next adjustment step is carried out while the energization to the sputtering chambers for which the deposition conditions have already been adjusted in the previous adjustment steps is maintained, the stable state of the sputtering discharge can be maintained. Moreover, step S117 in the embodiment shown in FIG. 6B is carried out continuously with the previous adjustment step S116, and accordingly, in step S117, a discharge state and a distribution of gas concentrations are stable. Therefore, the thickness deviation is less likely to occur, and a time required for the final adjustment of the deposition conditions can be shortened, which results in enhancement of the production efficiency.

Although the energization to the sputtering chambers is started in order from the upstream sputtering chamber and sputtering conditions therefor are adjusted in FIG. 6B and FIG. 6C, an order of the adjustment is not particularly limited. For example, as in adjustment steps S131 to S136 in an embodiment shown in FIG. 6D, the deposition conditions may be adjusted for the sputtering chambers in order from the downstream sputtering chamber.

In the embodiments shown in FIG. 6B, FIG. 6C and FIG. 6D, the deposition conditions for the nine sputtering chambers are individually adjusted by the six adjustment steps. It is also possible to further reduce the number of adjustment steps. Specifically, it is possible to reduce the number of adjustment steps to a maximum value of the sub-thin-films included in one thin-film. In the embodiment of the anti-reflection film 100 shown in FIG. 1 (Table 1), the niobium oxide layer 53 includes the four sub-thin-films, and this number four is the maximum value of the number of sub-thin-films included in one thin-film. Therefore, the number of adjustment steps in the preliminary deposition for producing the anti-reflection film can be reduced to four.

FIG. 7A shows an example of an embodiment of individually adjusting the deposition conditions for the nine sputtering chambers by four adjustment steps. In this embodiment, the four adjustment steps S141 to S144 are assigned respectively to the adjustment of the deposition conditions for the sputtering chambers 7 to 10 for depositing the four sub-thin-films 53a, 53b, 53c and 53d. As described above, the adjustment steps S141 to S144 are assigned to the adjustment of the deposition conditions for the respective sub-thin-films of the niobium oxide layer 53 including the largest number of sub-thin-films, whereby the number of adjustment steps can be reduced.

The adjustment steps can be appropriately assigned to the adjustment of the deposition conditions for the sputtering chamber for depositing the thin-films other than the niobium oxide layer 53. In the embodiment shown in FIG. 7A, the deposition conditions for four sputtering chambers 2, 3, 4 and 8 are adjusted in the first adjustment step S141. In contrast, in an embodiment shown in FIG. 7B, the deposition conditions for three sputtering chambers 2, 3 and 4 are adjusted in a first adjustment step S151, and the number of sputtering chambers subjected to the adjustment in one adjustment step is reduced. As described above, the sputtering chambers to be subjected to the adjustment are distributed to the plurality of adjustment steps, whereby the number of sputtering chambers to be subjected to the adjustment in one adjustment step is reduced, which results in reduction of complexity in the adjustment.

In each of the embodiments in FIG. 7A and FIG. 7B, the decomposition conditions for the niobium oxide layer 51 and the silicon oxide layer 52 in the sputtering chamber 2 and the sputtering chamber 3 are adjusted in the first adjustment step. In contrast, as in an embodiment shown in FIG. 7C, the adjustment of the deposition conditions for the niobium oxide layer 51 and the adjustment of the deposition conditions for the silicon oxide layer 52 may be carried out in two different adjustment steps.

As described above, in the present invention, the thicknesses of the plurality of thin-films are calculated on the basis of the wavelengths of the reflection spectrum (i.e., the functions of the reflectance with respect to the wavelength), and the deposition conditions for the plurality of sputtering chambers are adjusted on the basis of the calculated thicknesses. Therefore, in comparison with the case of calculating the thicknesses of the single-layer thin-films on the basis of the peak wavelengths of the reflection spectrum, the number of adjustment steps in the preliminary deposition is reduced, and the production efficiency can be enhanced. Moreover, the deposition conditions in the preliminary deposition process are adjusted on the basis of the reflection spectral waveforms, and accordingly, finer adjustment is enabled, and a multilayered optical thin-film with less thickness distribution can be formed.

In the main deposition, deposition is carried out using, as initial conditions, the deposition conditions obtained in the preliminary deposition, and as necessary, the deposition conditions may be readjusted while the reflection spectrum is measured in the optical measuring unit. If the deposition conditions are adjusted in the preliminary deposition so that the thicknesses of the respective sub-thin-films become uniform, it is easy to adjust the deposition conditions even if the distribution in the width direction occurs in the reflectance. Therefore, a high-quality anti-reflection film excellent in uniformity of the reflectance and uniformity of the hue of the reflected light is obtained.

A typical use of the anti-reflection film is an anti-reflection layer-equipped polarizing plate including an anti-reflection layer on a surface of the polarizing plate. The polarizing plate has a configuration in which transparent films are laminated on both surfaces of a polarizer, and the anti-reflection layer-equipped polarizing plate includes the anti-reflection layer on a surface of the transparent film laminated on a viewing-side of the polarizer.

Methods for manufacturing the anti-reflection layer-equipped polarizing plate described above include: forming an anti-reflection layer on a surface of a polarizing plate in which a transparent film is laminated on a surface of a polarizer; and forming a polarizing plate by laminating, on a polarizer, a transparent film in which an anti-reflection layer is formed on a surface.

<Substrate Film Used in Preliminary Deposition>

The polarizing plate is more expensive than a single component transparent film. Accordingly, when the polarizing plate is used as the film substrate in the preliminary deposition, a cost increase due to a loss of the substrate in the preliminary deposition becomes significant. Therefore, in the case of forming the anti-reflection layer on the surface of the polarizing plate in the main deposition, it is preferable to perform the preliminary deposition using another film substrate.

As mentioned above, from a viewpoint of enhancing the productivity, it is preferable to use the same film substrate in the preliminary deposition and the main deposition. Therefore, from viewpoints of reducing the production cost and enhancing the productivity, preferable is a method of fabricating the anti-reflection film by forming the anti-reflection layer on the transparent film and then fabricating the anti-reflection layer-equipped polarizing plate by laminating the anti-reflection film and the polarizing plate. Moreover, when the sputtering deposition is carried out on the polarizing plate, there is an apprehension that the polarizer may deteriorate by being exposed to a high-temperature environment and a high-output plasma. Therefore, also from a viewpoint of suppressing the deterioration of the polarizer, it is preferable that the sputtering deposition be carried out on the transparent film substrate in both of the preliminary deposition and the main deposition.

Meanwhile, in the case of using the transparent film substrate, as mentioned above, it is necessary to consider the back surface reflected light component $R_b$ in the measurement of the reflection spectrum. Generally, while the anti-reflection film is designed so that a visible light reflectance of the surface on which the anti-reflection layer is formed becomes 1% or less, a visible light reflectance on the back surface (the interface between the transparent film and air) of the transparent film is approximately 4%. Therefore, most of the reflected light detected in the in-line optical element is reflected light from the back surface, and it might be difficult to accurately evaluate the reflection spectrum on the surfaces on which the thin-films are formed. Following the above, thickness measuring accuracy for each of the thin-films in the preliminary deposition decreases, and it might be impossible to appropriately adjust the deposition conditions.

Therefore, in the case of forming the thin-films on the transparent film, it is preferable to constitute the film substrate so that an influence of the back-surface reflection can be eliminated in each of the preliminary deposition and the main deposition. For example, a light scattering material that scatters the visible light or a light absorbing material that absorbs the visible light is laminated on the back surface of the transparent film (i.e., the surface on which the thin-films are not formed), whereby the back-surface reflection can be reduced.

A material having visible light transmittance of 40% or less is preferable as the light absorbing material, and example thereof include a black film. Examples of the light scattering material include a diffusing pressure sensitive adhesive layer having a haze of 40% or more. Particularly, it is preferable to eliminate the influence of the back-surface reflection by releasably attaching a light absorbing film on the back surface of the transparent film with an adhesive layer interposed therebetween.

By laminating the light absorbing film with the visible light transmittance of 40% or less, the back-surface reflectance can be set to less than 1%. As a material of the light absorbing film, cellulose polymers, acryl-based polymers, styrene-based polymers, amide-based polymers, polyolefins, cyclic polyolefins, polycarbonates or the like may be used. Black pigment such as carbon black is added to a resin material as described above, or a colored layer by black ink is disposed on a surface of a base film, whereby the light absorbing film is obtained. From a viewpoint of handling easiness of the film substrate in the sputtering deposition, a thickness of the light absorbing film is preferably 5 μm to 200 μm, more preferably 10 μm to 130 μm, further preferably 15 μm to 110 μm.

In order to releasably attaching the light absorbing film on the back surface of the transparent film, it is preferable to laminate the light absorbing film and the transparent film with a pressure sensitive adhesive interposed therebetween. As the pressure sensitive adhesive, for example, acryl-based pressure sensitive adhesive, rubber-based pressure sensitive adhesives, silicone-based pressure sensitive adhesive or the like can be used. Among them, the acryl-based pressure sensitive adhesives containing acryl-based polymers as main components are suitably used.

By using the laminated film substrate in which the light absorbing film with a small visible light transmittance is attached to the back surface of the transparent film, the measurement of the reflection spectrum and the calculation of the thicknesses on the basis of the measurement can be carried out while the influence of the back surface reflected light component RI) is small and determined as ignorable. Accordingly, the adjustment accuracy for the deposition conditions in the preliminary deposition can be enhanced. Moreover, this laminated film substrate is used in both of the preliminary deposition and the main deposition, whereby the preliminary deposition and the main deposition can be carried out continuously without exchanging the film substrate. Accordingly, the productivity of the optical film such as the anti-reflection film can be enhanced.

The light absorbing film is released and removed from the anti-reflection film (the laminate of the light absorbing film and the transparent film on which the anti-reflection layer is formed) obtained in the main deposition, and the transparent film and the polarizer are laminated to obtain the anti-reflection layer-equipped polarizing plate.

EXAMPLES

Hereinafter, the present invention will be explained more detail by showing examples. However, the present invention is not limited to the following examples.

A black PET film (width: 1300 mm) having a thickness of 100 μm, a visible light transmittance of 0.01% and a refractive index of 1.65 was set to the unwinding roll of the roll-to-roll sputtering apparatus, the adjustment steps S151 to S154 shown in FIG. 7B were carried out, and the deposition conditions for the anti-reflection layer were adjusted. The conveyance speed of the substrate in the adjustment steps S151 to S154 was set to 0.7 m/min.

Si targets were used for depositing silicon oxide, and Nb targets were used for depositing niobium oxide. Each of the thin-films was deposited with introducing argon and oxygen into the sputtering chamber while performing PEM control at four positions in the width direction.

The in-line measurement of the reflection spectra was carried out at 23 positions in the width direction. On the basis of the obtained reflection spectra, the thicknesses at 23 positions in the width direction were calculated, and the set value (SP) of the plasma emission intensity was changed. The calculation of the thicknesses and the change of the SP were repeated until the thickness distribution in the width direction fell within the permissible range. The reflection spectra at 23 positions in the width direction before and after the adjustment of the deposition conditions in the adjustment steps S151 to S154 are shown in FIGS. 8 to 11. In FIGS. 8 to 11, left graphs show the reflection spectra before the adjustment, and right graphs show the reflection spectra after the adjustment.

In the first adjustment step S151 (FIG. 8), no peak wavelengths appear on the reflection spectra. Therefore, in the method of adjusting the deposition conditions on the basis of the peak wavelengths of the reflectances, it is necessary to change the conveyance speed of the substrate so that the peaks of the reflectances appear as a result of the change. In contrast, in this example, the thicknesses are measured on the basis of the reflection spectral waveforms, and the deposition conditions are adjusted on the basis measured thicknesses. Accordingly, it can be seen that, even if no peaks appear in the spectra, fluctuations in the reflection spectra in the width direction can be reduced to a large extent without changing the conveyance speed of the substrate.

In step S152 (FIG. 9), before the adjustment of the deposition conditions, reflectance minimum was confirmed at around a wavelength of 480 nm in each of the reflection spectra at 23 positions in the width direction. In the method for adjusting the deposition conditions on the basis of the peak wavelengths of the reflectances, the conditions are not adjusted any more when the peak wavelengths at the minimum reflectance are substantially the same. In contrast, in the embodiment of measuring the thicknesses on the basis of the reflection spectral waveforms, the variations of the reflectances of wavelengths longer than the wavelength of 500 nm in the width direction are reduced while the peak wavelength (around 480 nm) at the minimum reflectance is substantially maintained by adjusting the deposition conditions. Also in step S153 (FIG. 10) and step S154 (FIG. 11), it can be understood that the wavelengths of the reflection spectra are approximated by finer adjustment for the deposition conditions than the adjustment based on the peak wavelengths.

Figure 12:
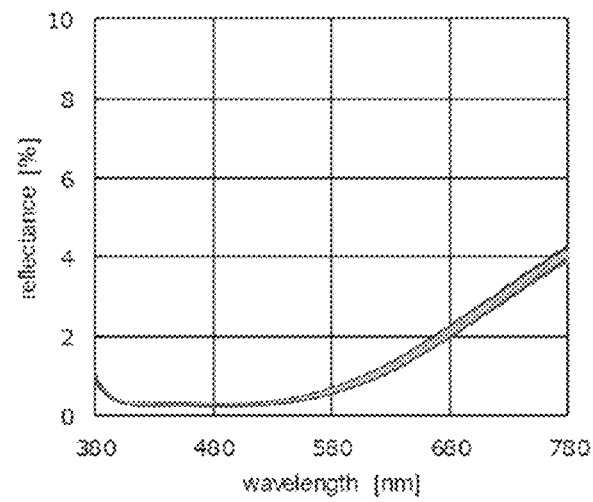
FIG. 12 shows reflection spectra at 23 positions in a width direction of an anti-reflection film subjected to deposition at the same substrate conveyance speed as a speed in main deposition after the deposition conditions are adjusted by steps S151 to S154.

FIG. 12 shows reflection spectra measured at 23 positions in the width direction while the conveyance speed of the substrate is changed to the same substrate conveyance speed (1.4 m/min.) as that in the main deposition after the adjustment (FIG. 11) of the deposition conditions is carried out at the adjustment step S154 in the preliminary deposition. It can be understood that a high-quality anti-reflection layer is obtained in which fluctuations of the reflection spectra in the width direction is little and uniformity in the reflected light properties is high. Moreover, in spite that the deposition is carried out continuously without adjusting the deposition conditions, the target reflection spectra are obtained by merely changing the conveyance speed after the adjustment of the deposition conditions for the respective sputtering chambers in the adjustment steps is ended. From this result, it can be understood that, in the production method of the present invention, the number of adjustment steps in the preliminary deposition can be reduced and the productivity of the anti-reflection film can be enhanced.

DESCRIPTION OF REFERENCE SIGNS 20 film substrate
30 adhesion enhancement layer
50 multilayered optical thin-film (anti-reflection layer)
51, 52, 53, 54 thin-film
100 anti-reflection film
1 to 10 sputtering chamber
221, 222 deposition roll
251 to 260 cathode
290 optical measuring unit
310 reactive gas introduction pipe
320 inert gas introduction pipe
311 to 314 mass flow controller
319, 329 gas injection nozzle
341 to 344 plasma emission monitor (PEM)

The invention claimed is:

1. A method for producing a multilayered optical thin-film composed of a plurality of thin-films, the method comprising:
forming the multilayered optical thin-film on a film substrate by sputtering in a roll-to-roll sputtering deposition apparatus while the film substrate is continuously conveyed in the roll-to-roll sputtering deposition apparatus, the sputtering deposition apparatus including a plurality of sputtering chambers along a substrate conveyance direction and an optical measuring unit configured to measure an optical property,
the sputtering including
preliminary deposition in which deposition conditions of thin-films are adjusted while forming the thin-films on the film substrate in the roll-to-roll sputtering deposition apparatus; and
main deposition performed after the preliminary deposition,
wherein the main deposition is performed to form the multilayered optical thin-film including all the plurality of thin-films using the deposition conditions adjusted during the preliminary deposition,
wherein the preliminary deposition includes a plurality of adjustment steps, each adjustment step adjusting deposition conditions of corresponding one or more, but not all, of the thin-films included in the multilayered optical thin-film, while continuously conveying the film substrate along the substrate conveyance direction and forming at least one of the thin-films, including the corresponding one or more of the thin-films, on the film substrate,
wherein, in at least one of the plurality of adjustment steps, a stack of thin-films made of two or more different materials is deposited on the film substrate by simultaneously energizing two or more of the sputtering chambers, and an optical property of a stacked body in which a plurality of thin-films are formed on the film substrate is obtained by the optical measuring unit,
wherein, in the at least one of the plurality of adjustment steps, thicknesses of the plurality of thin-films are calculated from the optical property obtained by the optical measuring unit, and the deposition conditions for the respective thin-films are adjusted until the optical property obtained by the optical measuring unit or the thicknesses of the respective thin-films calculated from the optical property falls within a predetermined range, and
wherein at least one of the plurality of thin-films which constitute the multilayered optical thin-film is a stack of a plurality of sub-thin-films wherein each of the plurality of sub-thin films is made of an identical material, and wherein each of the plurality of sub-thin film is deposited in a separate sputtering chamber of the plurality of sputtering chambers,
and
deposition conditions are adjusted separately for each sub-thin film of the plurality of sub-thin-films in said separate sputtering chamber of the plurality of sputtering chambers.

2. The method according to claim 1, wherein
in each of the plurality of adjustment steps, a reflection spectrum of the stacked body is measured by the optical measuring unit, and in at least one of the plurality of adjustment steps, the thicknesses of the plurality of thin-films are calculated from the reflection spectrum.

3. The method according to claim 2, wherein
in each of the plurality of adjustment steps, the deposition conditions for the plurality of thin-films are adjusted based on measured values of the thicknesses of the respective thin-films calculated from the reflection spectrum, and
the deposition conditions for the respective thin-films are adjusted until the measured values of the thicknesses of the plurality of thin-films fall within predetermined ranges.

4. The method according to claim 2, wherein
in each of the plurality of adjustment steps, the deposition conditions for the plurality of thin-films are adjusted based on measured values of the thicknesses of the respective thin-films calculated from the reflection spectrum, and
the deposition conditions for the respective thin-films are adjusted until difference between the reflection spectrum obtained by measurement in the optical measuring unit and a target reflection spectrum falls within a predetermined range.

5. The method according to claim 1,
wherein conveyance speeds of the film substrate in the plurality of adjustment steps are the same.

6. The method according to claim 1,
wherein, in each of the plurality of adjustment steps, optical properties at a plurality of positions in a width direction perpendicular to the substrate conveyance direction are measured by the optical measuring unit, and thicknesses of each of the thin-films at a plurality of positions in the width direction are calculated from the obtained optical properties, and
a thickness distribution of each of the thin-films in the width direction is reduced by adjusting the deposition conditions at the plurality of positions in the width direction.

7. The method according to claim 1,
wherein the roll-to-roll sputtering deposition apparatus includes a plasma emission monitor that senses a plasma emission intensity of sputtering deposition in each of the sputtering chambers, and
wherein a flow rate of gas introduced into each of the sputtering chambers is adjusted so that the plasma emission intensity detected by the plasma emission monitor falls within a set range.

8. The method according to claim 7,
wherein the roll-to-roll sputtering deposition apparatus includes a plurality of plasma emission monitors at a plurality of positions in a width direction perpendicular to the substrate conveyance direction in the sputtering chamber,
wherein the plurality of plasma emission monitors is capable of setting set value of the plasma emission intensity independently of one another, and
wherein flow rates of the gas introduced into corresponding positions in the width direction are adjusted such that emission intensities detected by the respective plasma emission monitors fall within a set range.

9. The method according to claim 7, wherein the deposition condition in each of the plurality of adjustment steps is adjusted by changing the set value of the plasma emission intensity of the plasma emission monitor.

10. The method according to claim 1, wherein, the film substrate is a laminated body including: a transparent film: a light absorbing member releasably attached to a surface of the transparent film on which the thin-film is not formed; and an adhesive layer interposed between the transparent film and the light absorbing member.

11. The method according to claim 1, wherein the film substrate used in the preliminary deposition is continuously used as the film substrate in the main deposition.

12. The method according to claim 11, wherein, after the preliminary deposition, the main deposition is carried out continuously in a state where the energization to the sputtering chambers is continued.

13. The method according to claim 11, wherein the film substrate is a laminated body including: a transparent film: a light absorbing member releasably attached to a surface of the transparent film on which the thin-film is not formed; and an adhesive layer interposed between the transparent film and the light absorbing member.

14. The method according to claim 13, wherein after the preliminary deposition, the main deposition is carried out continuously in a state where the energization to the sputtering chambers is continued.

15. The method according to claim 1, wherein the multilayered optical thin-film is an anti-reflection layer composed of a plurality of oxide thin-films.

16. The method according to claim 1, wherein, the film substrate is a laminated body including: a transparent film: a light absorbing member releasably attached to a surface of the transparent film on which the thin-film is not formed; and an adhesive layer interposed between the transparent film and the light absorbing member.

17. The method according to claim 1, wherein
in each of the plurality of adjustment steps, reflection spectra of the stacked body are measured at a plurality of positions in a width direction perpendicular to the substrate conveyance direction by the optical measuring unit, and thicknesses of each of the thin-films at a plurality of positions in the width direction are calculated from the obtained reflection spectra.

18. The method according to claim 17, wherein a thickness distribution of each of the thin-films in the width direction is reduced by adjusting the deposition conditions at the plurality of positions in the width direction.

* * * * *